(12) United States Patent
Kim et al.

(10) Patent No.: US 12,408,514 B2
(45) Date of Patent: Sep. 2, 2025

(54) DISPLAY DEVICE AND METHOD OF PROVIDING THE SAME

(71) Applicant: Samsung Display Co., Ltd., Yongin-si (KR)

(72) Inventors: Jiyoon Kim, Seongnam-si (KR); Changhee Lee, Seoul (KR); Yoolguk Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 532 days.

(21) Appl. No.: 17/708,670

(22) Filed: Mar. 30, 2022

(65) Prior Publication Data
US 2023/0044202 A1    Feb. 9, 2023

(30) Foreign Application Priority Data
Aug. 3, 2021 (KR) .......................... 10-2021-0102214

(51) Int. Cl.
| | |
|---|---|
| *H10K 59/122* | (2023.01) |
| *H10K 50/844* | (2023.01) |
| *H10K 59/12* | (2023.01) |
| *H10K 71/00* | (2023.01) |
| *H10K 102/00* | (2023.01) |

(52) U.S. Cl.
CPC ......... *H10K 59/122* (2023.02); *H10K 50/844* (2023.02); *H10K 71/00* (2023.02); *H10K 59/1201* (2023.02); *H10K 2102/00* (2023.02)

(58) Field of Classification Search
CPC ............. H10K 59/122; H10K 59/1201; H10K 59/80522; H10K 59/35; H10K 59/131; H10K 50/844; H10K 50/11; H10K 50/14; H10K 50/824; H10K 71/00; H10K 71/135; H10K 71/60; H10K 2102/00
See application file for complete search history.

(56) References Cited

U.S. PATENT DOCUMENTS

| | | | |
|---|---|---|---|
| 7,265,391 B2 | 9/2007 | Yamazaki et al. | |
| 10,338,449 B2 | 7/2019 | Kang et al. | |
| 10,727,433 B2 | 7/2020 | Lee et al. | |
| 2012/0074388 A1* | 3/2012 | Park ...................... | H10K 59/124 438/23 |
| 2016/0111688 A1* | 4/2016 | Lee ......................... | H10K 71/00 438/34 |
| 2019/0237527 A1* | 8/2019 | Lee ........................ | H10K 50/822 |
| 2020/0303687 A1* | 9/2020 | Liu .......................... | H10K 71/80 |

(Continued)

FOREIGN PATENT DOCUMENTS

| | | | | |
|---|---|---|---|---|
| CN | 109473459 A | * | 3/2019 | ......... H01L 27/3246 |
| CN | 113035923 A | * | 6/2021 | ........... H01L 27/322 |

(Continued)

*Primary Examiner* — Teresa M. Arroyo
(74) *Attorney, Agent, or Firm* — CANTOR COLBURN LLP

(57) ABSTRACT

A display device includes a base layer, a first electrode on the base layer, a pixel-defining layer in which an opening exposing an upper surface of the first electrode is defined, a protective layer overlapping the pixel-defining layer and between the pixel-defining layer and the first electrode, a functional layer on the first electrode in the opening, an auxiliary electrode on an upper surface of the pixel-defining layer, and a second electrode on the functional layer and the auxiliary electrode.

9 Claims, 14 Drawing Sheets

(56) References Cited

U.S. PATENT DOCUMENTS

2021/0149524 A1* 5/2021 Bang .................... G06F 3/04164
2021/0359008 A1* 11/2021 Zhang .................... G02B 5/223

FOREIGN PATENT DOCUMENTS

| JP | 5061562 B2 | 10/2012 |
| KR | 10-0979925 B1 | 9/2010 |
| KR | 20180005327 A | 1/2018 |
| KR | 20190126018 A | 11/2019 |

* cited by examiner

DISPLAY DEVICE AND METHOD OF PROVIDING THE SAME

This U.S. non-provisional patent application claims priority to Korean Patent Application No. 10-2021-0102214, filed on Aug. 3, 2021, and all the benefits accruing therefrom under 35 U.S.C. § 119, the entire contents of which are hereby incorporated by reference.

BACKGROUND

(1) Field

The present disclosure herein relates to a display device and a method of providing the same. More particularly, the present disclosure herein relates to a display device including a light-emitting element having stacked functional layers, and a method of providing the same.

(2) Description of the Related Art

In providing a light-emitting element included in various electronic devices, for example, multi-media devices such as televisions, mobile phones, tablet computers, navigation systems, game consoles, etc., methods such as inkjet printing are being used.

When functional layers of a light-emitting element are provided through coating methods such as inkjet printing, electrodes are coated with functional layers in pixel regions divided by a partition wall, etc., and the functional layers between adjacent pixel regions are separated from each other with a partition wall therebetween.

SUMMARY

The present disclosure provides a display device with improved display quality and reliability, as functional layers in light-emitting elements separated by a pixel-defining layer have excellent adhesion characteristics and coating film characteristics.

The present disclosure also provides a method of providing a display device having excellent display quality, by making a pixel-defining layer and an electrode having different surface characteristics from each other after a liquid-repellent treatment of the pixel-defining layer, to thereby improve the coating quality of functional layers.

An embodiment provides a display device including a base layer, a first electrode on the base layer, a pixel-defining layer in which an opening exposing an upper surface of the first electrode is defined, a protective layer overlapping the pixel-defining layer and between the pixel-defining layer and the first electrode, a functional layer on the first electrode in the opening, an auxiliary electrode on an upper surface of the pixel-defining layer, and a second electrode on the functional layer and the auxiliary electrode.

In an embodiment, the protective layer may be directly between the pixel-defining layer and the first electrode, and the protective layer may have one end overlapping an edge of the pixel-defining layer, and the other end overlapping an edge of the first electrode.

In an embodiment, the protective layer may include a water-soluble metal oxide.

In an embodiment, the protective layer may include a tungsten oxide, or a molybdenum oxide.

In an embodiment, on a cross-section perpendicular to the base layer, the upper surface of the pixel-defining layer may include an exposed surface not overlapping the auxiliary electrode, and the width of the exposed surface, from an edge of the upper surface of the pixel-defining layer to an edge of the auxiliary electrode, may be about 3 micrometers (p.m) or more.

In an embodiment, the exposed surface of the pixel-defining layer may be hydrophobic.

In an embodiment, the functional layer may include an inkjet-printed hole transport region on the first electrode, an inkjet-printed light-emitting layer on the hole transport region, and an inkjet-printed electron transport region on the light-emitting layer.

In an embodiment, the second electrode may be a common layer overlapping an entirety of the functional layer and the pixel-defining layer.

In an embodiment, the second electrode may be directly on the auxiliary electrode.

In an embodiment, the thickness of the protective layer may be less than the thickness of the first electrode.

In an embodiment, the protective layer may include a first portion between the first electrode and the pixel-defining layer, a second portion between the circuit layer and the pixel-defining layer, and not overlapping the first electrode, and a third portion between the first portion and the second portion.

In an embodiment, a display device includes a pixel-defining layer in which an opening is defined, an auxiliary electrode on the pixel-defining layer, a protective layer under the pixel-defining layer, and overlapping at least a part of the pixel-defining layer, and a light-emitting element including a plurality of functional layers in the opening, a first electrode under the functional layers, and overlapping at least a part of the protective layer, and a second electrode on the functional layers, and electrically connected to the auxiliary electrode.

In an embodiment, the protective layer may include a water-soluble metal oxide.

In an embodiment, one end of the protective layer may be exposed in the opening, and may contact at least one of the functional layers.

In an embodiment, the other end of the protective layer may overlap an edge of the first electrode overlapping the pixel-defining layer.

In an embodiment, the protective layer may overlap the entire pixel-defining layer, and may include a first portion overlapping the first electrode, and a second portion not overlapping the first electrode.

In an embodiment, a method of providing a display device includes providing a first electrode on a base layer, providing a protective layer on the first electrode, providing a pixel-defining layer in which an opening is defined to expose an upper surface of the protective layer, providing an auxiliary electrode on an upper surface of the pixel-defining layer, providing a liquid-repellent treatment on the pixel-defining layer, providing removal of the exposed protective layer using water, providing a functional layer on the first electrode exposed after removal of the protective layer, and providing a second electrode on the functional layer and the auxiliary electrode.

In an embodiment, the protective layer may be a water-soluble metal oxide.

In an embodiment, the providing of the liquid-repellent treatment on the pixel-defining layer may include treating the pixel-defining layer with CF4 plasma.

In an embodiment, in the removal of the protective layer, the protective layer may be removed at a speed of about 50 angstroms per minute (Å/min) to about 100 Å/min.

In an embodiment, after the removal of the protective layer, the contact angle of methylethylbenzoate with the upper surface of the pixel-defining layer may be about 60 degrees (°) or more, and the contact angle of methylethylbenzoate with an upper surface of the first electrode may be about 5° or less.

In an embodiment, the functional layers may include a hole transport region on the first electrode, a light-emitting layer on the hole transport region, and an electron transport region on the light-emitting layer, and the providing of the functional layer may include providing each of the hole transport region, the light-emitting layer, and the electron transport region through inkjet printing.

In an embodiment, the providing of the second electrode may include providing the second electrode through vapor deposition.

In an embodiment, the providing of the protective layer may include providing the protective layer on the base layer to cover the first electrode.

In an embodiment, the forming of the pixel-defining layer may include disposing an entirety of the entire pixel-defining layer overlapping the protective layer.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain the invention. In the drawings.

DETAILED DESCRIPTION

Figure 1:
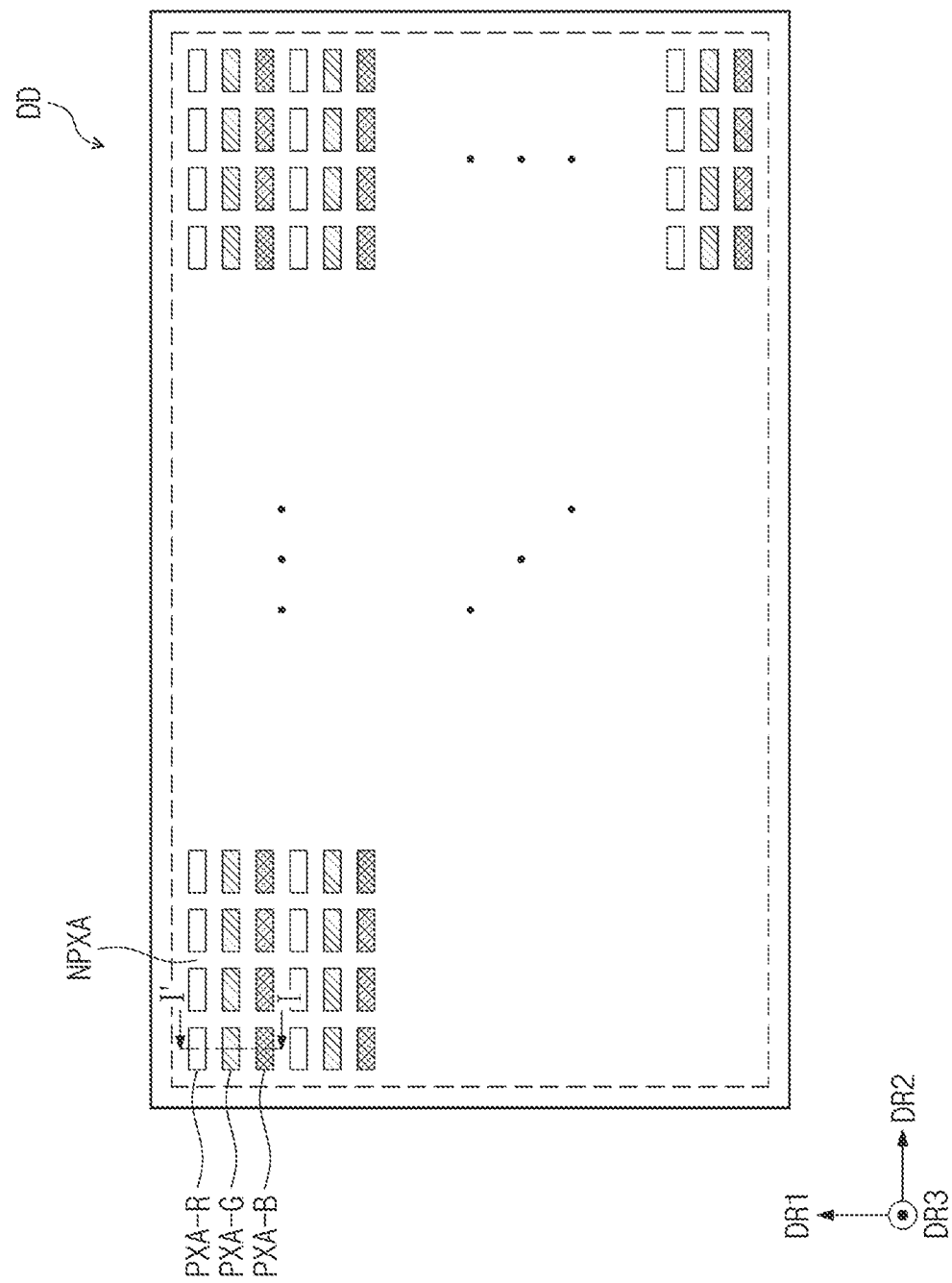
FIG. 1 is a plan view of an embodiment of a display device.

In the invention, various modifications may be made and various forms may be applied, and embodiments will be illustrated in the drawings and described in detail in the text. However, this is not intended to limit the invention to a specific disclosure form, it should be understood to include all changes, equivalents, and substitutes included in the spirit and scope of the invention.

In this specification, when a component (or region, layer, portion, etc.) is referred to as being related such as "on", "connected", or "coupled" to another component, it means that it is placed/connected/coupled directly on the other component or a third component can be disposed between them. In contrast, when an element is referred to as being related to another element such as being "directly on," "directly connected to" or "directly coupled to" another element or layer, there are no intervening elements or layers present.

In the present application, "directly in contact" may mean that there is no layer, film, region, plate, etc. added between a portion such as a layer, film, region, or plate and another portion. For example, "direct contact" may mean placing two layers or two members without using an additional member such as an adhesive member therebetween, forming an interface therebetween etc.

The same reference numerals or symbols refer to the same elements. In addition, in the drawings, thicknesses, ratios, and dimensions of components are exaggerated for effective description of technical content. As used herein, a reference number may indicate a singular element or a plurality of the element. For example, a reference number labeling a singular form of an element within the drawing figures may be used to reference a plurality of the singular element within the text of specification. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." "And/or" includes all combinations of one or more that the associated elements may define.

Terms such as first and second may be used to describe various components, but the components should not be limited by the terms. These terms are only used for the purpose of distinguishing one component from other components. For example, without departing from the scope of the invention, a first component may be referred to as a second component, and similarly, a second component may be referred to as a first component. Singular expressions include plural expressions unless the context clearly indicates otherwise.

In addition, terms such as "below", "lower", "above", and "upper" are used to describe the relationship between components shown in the drawings. The terms are relative concepts and are described based on the directions indicated in the drawings. In the present specification, "disposed on" may refer to a case of being disposed not only on the upper part of any one member but also on the lower part.

Terms such as "include" or "have" are intended to designate the presence of a feature, number, step, action, component, part, or combination thereof described in the specification, and it should be understood that it does not preclude the possibility of presence or addition of one or more other features, numbers, steps, operations, components, parts, or combinations thereof "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used in this specification have the same meaning as commonly understood by one of ordinary skill in the art to which this invention belongs. In addition, terms such as terms defined in commonly used dictionaries should be interpreted as having a meaning consistent with the meaning having in the context of the related technology, and should not be interpreted as too ideal or too formal unless explicitly defined here.

Hereinafter, an embodiment of a display device DD and a method of manufacturing (or providing) a display device DD will be described with reference to the accompanying drawings.

Figure 2:
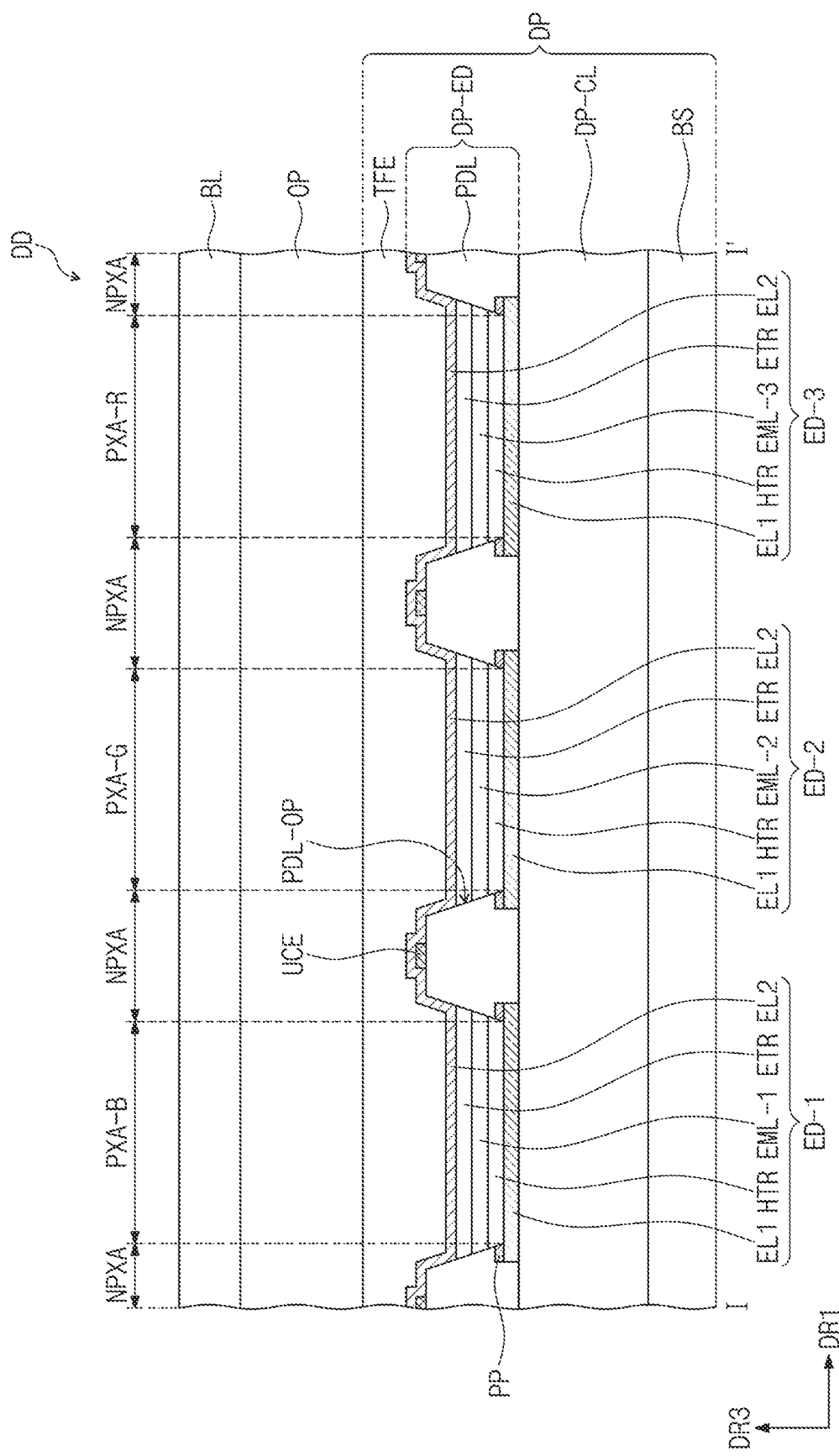
FIG. 2 is a cross-sectional view of an embodiment of a display device.
Figure 3:
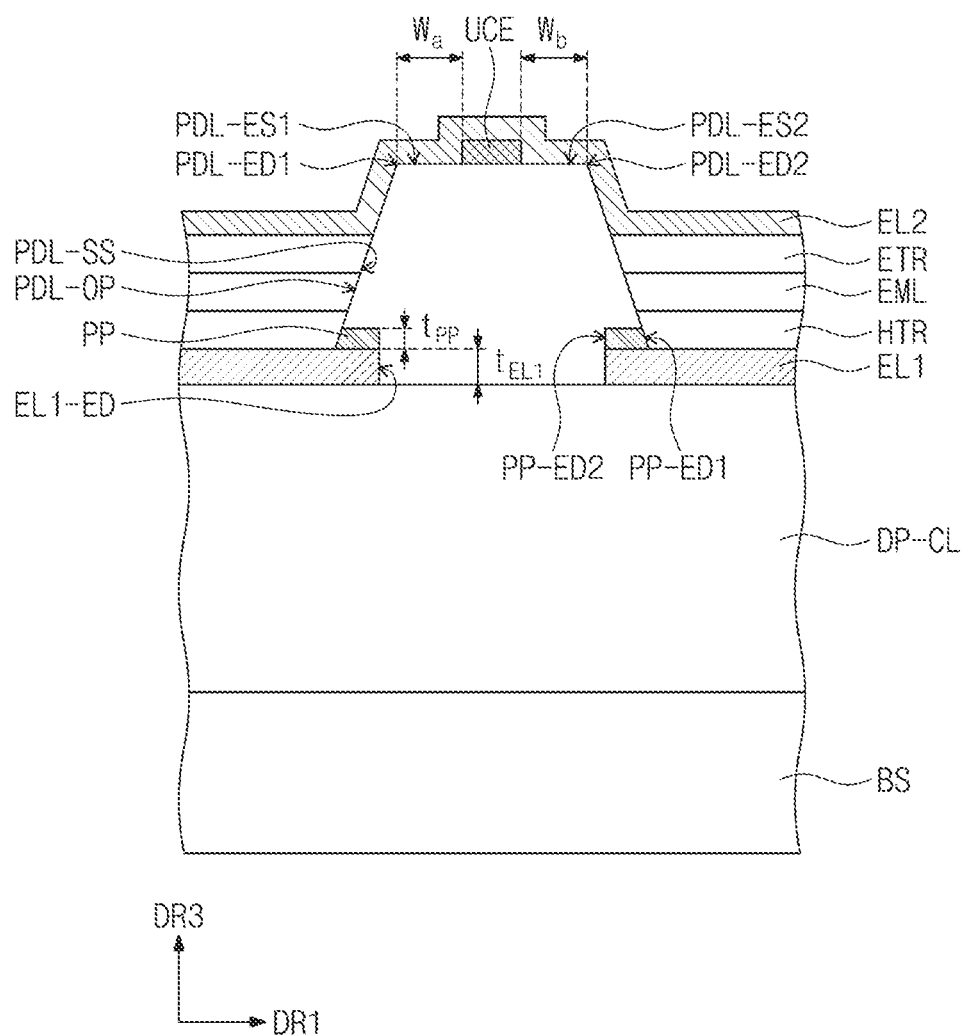
FIG. 3 is a cross-sectional view of an embodiment of a display device.

FIG. 1 is a plan view of an embodiment of a display device DD. FIG. 2 is a cross-sectional view of an embodiment of a display device DD. FIG. 2 is a cross-sectional view taken along line I-I' of FIG. 1. FIG. 3 is a cross-sectional view illustrating an embodiment of a portion of a display device DD.

A display device DD illustrated in FIGS. 1 and 2 may include a plurality of light-emitting regions PXA-B, PXA-G, and PXA-R. The display device DD may include a first light-emitting region PXA-B, a second light-emitting region PXA-G, and a third light-emitting region PXA-R which are separated (or spaced apart) from each other. In an embodiment, for example, the first light-emitting region PXA-B may be a blue light-emitting region that emits blue light, the second light-emitting region PXA-G may be a green light-emitting region that emits green light, and the third light-emitting region PXA-R may be a red light-emitting region that emits red light. However, the invention is not limited thereto, and the light-emitting areas (or regions) may additionally include a white light-emitting region, or a light-emitting region that emits light in a wavelength range other than blue, green and red.

When viewed on a plane defined by a first directional axis DR1 and a second directional axis DR2 crossing each other, the first to third light-emitting regions PXA-B, PXA-G, and PXA-R may be separated from each other without overlapping, and portions of a non-light-emitting region NPXA (otherwise herein referred to as non-light-emitting regions NPXA) may be disposed between adjacent light-emitting regions PXA-B, PXA-G, and PXA-R.

The first directional axis DR1 to the third directional axis DR3 are illustrated in FIG. 1 and the consecutive drawings, and directions indicated by the first to third directional axes DR1, DR2, and DR3 described in the present specification are relative concepts and may thus be changed into other directions. In addition, the directions indicated by the first to third directional axes DR1, DR2, and DR3 may be referred to as first to third directions, and the same reference symbols may be used. In an embodiment, the first directional axis DR1 and the second directional axis DR2 may be orthogonal to each other, and the third directional axis DR3 may be a normal direction of a plane defined by the first directional axis DR1 and the second directional axis DR2, without being limited thereto.

In the present specification, the thickness direction of the display device DD may be a direction parallel to the third directional axis DR3 (e.g., a normal direction of a plane defined by the first directional axis DR1 and the second directional axis DR2). In the present specification, the front surface (or upper surface) and the rear surface (or lower surface) of each member constituting the display device DD may be defined with reference to the third directional axis DR3.

In the display device DD, the light-emitting regions PXA-B, PXA-G, and PXA-R may be regions that emit light generated by light-emitting elements ED-1, ED-2, and ED-3, respectively. The light-emitting regions PXA-B, PXA-G, and PXA-R may be respectively separated by portions of a pixel-defining layer PDL (otherwise herein referred to as pixel-defining layers PDL). The non-light-emitting regions NPXA are regions between adjacent light-emitting regions PXA-B, PXA-G, and PXA-R, and may correspond to the pixel-defining layers PDL. In the present specification, each of the light-emitting regions PXA-B, PXA-G, and PXA-R may correspond to a pixel.

In the display device DD illustrated in FIG. 1, the light-emitting regions PXA-B, PXA-G, and PXA-R are arranged in the form of a stripe. That is, in the display device DD illustrated in FIG. 1, a plurality of first light-emitting regions PXA-B, a plurality of second light-emitting regions PXA-G, and a plurality of third light-emitting region PXA-R may be each aligned along the second directional axis DR2. In addition, the first light-emitting region PXA-B, the second light-emitting region PXA-G, and the third light-emitting region PXA-R may be alternately arranged in order along the first directional axis DR1.

An arrangement form of the light-emitting regions PXA-B, PXA-G, and PXA-R is not limited to the configuration in FIG. 1, and an order in which the first light-emitting region PXA-B, the second light-emitting region PXA-G, and the third light-emitting region PXA-R are arranged may be provided in various combinations according to display quality characteristics required for the display device DD. In an embodment, for example, the arrangement form of the light-emitting regions PXA-B, PXA-G, and PXA-R may be a pentile arrangement form (PENTILE®), or a diamond arrangement form. In addition, areas of the light-emitting regions PXA-B, PXA-G, and PXA-R, combinations of the numbers of the light-emitting regions PXA-B, PXA-G, and PXA-R, which emit different light, planar shapes of the light-emitting regions PXA-B, PXA-G, and PXA-R, etc., may be variously adjusted or modified according to the display quality characteristics required for the display device DD.

Referring to FIG. 2, the display device DD may include a display panel DP, and a light control panel OP disposed on the display panel DP. The display panel DP may include a plurality of light-emitting elements ED-1, ED-2, and ED-3. The light control panel OP may be disposed on the display panel DP, and include at least one of a light control layer that converts the wavelength of light emitted from the light-emitting elements ED-1, ED-2, and ED-3, or an anti-reflective layer that controls reflected light caused by external light or reflected light generated by a circuit layer configuration inside the display panel DP.

In the display device DD, a plurality of light-emitting elements ED-1, ED-2, and ED-3 may emit light having different wavelength ranges. In an embodiment, for example, the display device DD may include a first light-emitting element ED-1 which emits blue light, a second light-emitting element ED-2 which emits green light, and a third light-emitting element ED-3 which emits red light. That is, a blue light-emitting region PXA-B, a green light-emitting region PXA-G, and a red light-emitting region PXA-R of the display device DD may correspond to the first light-emitting element ED-1, the second light-emitting element ED-2, and the third light-emitting element ED-3, respectively.

However, the invention is not limited thereto, and the first to third light-emitting elements ED-1, ED-2, and ED-3 may emit light in the same wavelength range, or at least one thereof may emit light having a wavelength range different from the others. In an embodiment, for example, all of the first to third light-emitting elements ED-1, ED-2, and ED-3 may emit blue light.

In an embodiment, when the first to third light-emitting elements ED-1, ED-2, and ED-3 of the display panel DP all emit blue light, the light control panel OP disposed on the display panel DP may include a light control layer including a light converter. The light control layer may include a light converter such as quantum dots, or phosphors. The light control layer may include a first light control portion corresponding to the red light-emitting region PXA-R, and including a red light converter for converting blue light to red light, and a second light control portion corresponding to a green light-emitting region PXA-G, and including green light converter for converting blue light to green light.

In addition, when the first to third light-emitting elements ED-1, ED-2, and ED-3 all emit blue light, the light control panel OP may additionally include the anti-reflective layer disposed on the light control layer. The anti-reflective layer may include a polarizing layer, or a color filter layer including a filter portion that transmits or absorbs light in a partial wavelength range. When the first to third light-emitting elements ED-1, ED-2, and ED-3 all emit blue light, the anti-reflective layer may be omitted in the light control panel OP.

In an embodiment of the display device DD, when the first to third light-emitting elements ED-1, ED-2, and ED-3 emit light having different wavelength ranges, for example, when the first to third light-emitting elements ED-1, ED-2, and ED-3 emit blue light, green light, and red light, respectively, the light control panel OP may not include the light control layer, and may include only the anti-reflective layer. In an embodiment of the display device DD, the light control panel OP may be omitted.

A base substrate BL may be disposed on the light control panel OP. The base substrate BL may face the display panel DP with the light control panel OP therebetween. The base substrate BL may be a member which provides a base surface on which the light control panel OP is disposed. The base substrate BL may be an inorganic layer, an organic layer, or a composite material layer. In addition, unlike the configuration illustrated in the drawing, the base substrate BL may be omitted in an embodiment.

In an embodiment, the display panel DP may include a base layer BS, a circuit layer DP-CL and a light-emitting element layer DP-ED which are each provided on the base layer BS, and an encapsulation layer TFE disposed on the light-emitting element layer DP-ED.

In the display device DD, the light-emitting element layer DP-ED may include pixel-defining layers PDL, light-emitting elements ED-1, ED-2, and ED-3 each including at least one functional layer disposed between the pixel-defining layers PDL, and auxiliary electrodes UCE disposed on the pixel-defining layers PDL. In addition, in the display device DD, the light-emitting element layer DP-ED may include a protective layer PP overlapping at least a part of the pixel-defining layer PDL. The protective layer PP may include a metal oxide.

In the display device DD, the display panel DP may be an organic electroluminescence display panel including an organic electroluminescence element in the light-emitting element layer DP-ED. In addition, the display panel DP may be a quantum dot display panel including, as a light-emitting material, quantum dots in the light-emitting element layer DP-ED.

In the display panel DP, the base layer BS may be a member which provides a base surface on which the circuit layer DP-CL or the light-emitting element layer DP-ED is disposed. The base layer BS may be a rigid substrate, or a flexible substrate which is bendable, foldable, rollable, etc.

The base layer BS may be a glass substrate, a metal substrate, a polymer substrate, etc. However, the invention is not limited thereto, and the base layer BS may be an inorganic layer, an organic layer, or a composite material layer. In addition, the base layer BS may have a multilayer structure. In an embodiment, for example, the base layer BS may include a first synthetic resin layer, an intermediate layer having a multilayered or single-layered structure, and a second synthetic resin layer disposed on the intermediate layer.

The first and second synthetic resin layer may be each an organic layer formed of a polymer material. In addition, in an embodiment, the base layer BS may include an organic layer formed of transparent polyimide.

In an embodiment, the circuit layer DP-CL may be disposed on the base layer BS. The circuit layer DP-CL may include an insulating layer, a semiconductor pattern, a conductive pattern, a signal line, etc. The insulating layer, the semiconductor layer, and the conductive layer may be formed on the base layer BS through coating, vapor deposition, etc., and then selectively patterned by performing a photolithography process multiple times. As a result, the semiconductor pattern, the conductive pattern, and the signal line included in the circuit layer DP-CL may be formed (or provided).

The circuit layer DP-CL may include a plurality of transistors (not shown). The transistors (not shown) may each include a control electrode, an input electrode, and an output electrode. In an embodiment, for example, the circuit layer DP-CL may include a switching transistor and a driving transistor for driving the light-emitting elements ED-1, ED-2, and ED-3 of the light-emitting element layer DP-ED.

The light-emitting element layer DP-ED may be disposed on the circuit layer DP-CL. The light-emitting element layer DP-ED may include light-emitting elements ED-1, ED-2, and ED-3. The light-emitting elements ED-1, ED-2, and ED-3 may each include a first electrode EL1, a second electrode EL2 facing the first electrode EL1, and functional layers FL disposed between the first electrode EL1 and the second electrode EL2, and include, as the functional layers FL, a hole transport region HTR, light-emitting layers EML-1, EML-2, and EML-3, and an electron transport region ETR.

In an embodiment, the hole transport region HTR, the light-emitting layers EML-1, EML-2, and EML-3, and the electron transport region ETR, etc., of the light-emitting elements ED-1, ED-2, and ED-3 may be provided through inkjet printing. The hole transport region HTR, the light-emitting layers EML-1, EML-2, and EML-3, and the electron transport region ETR may be sequentially provided in order from a base surface, through inkjet printing. The hole transport region HTR, the light-emitting layers EML-1, EML-2, and EML-3, and the electron transport region ETR formed by using inkjet printing may be formed by providing, as solution for a printing layer, a hole transport material, a light-emitting material, or an electron transport material together with a solvent, or may be formed from a hole transport compound, a light-emitting layer compound, or an electron transport compound without separately using a solvent.

In an embodiment, the second electrode EL2 may be provided through vapor deposition, etc. The second electrode EL2 may be a common layer overlapping the entirety of the functional layers FL and the pixel-defining layer PDL.

An auxiliary electrode UCE may be disposed in plural including a plurality of auxiliary electrodes UCE on the upper surface of the pixel-defining layer PDL which is furthest from the base layer BS (or the base surface). The second electrode EL2 may be disposed on the auxiliary electrode UCE, and the second electrode EL2 may be electrically connected to the auxiliary electrode UCE. The second electrode EL2 may be disposed directly on the auxiliary electrode UCE.

The pixel-defining layers PDL may be disposed on the circuit layer DP-CL. Openings PDL-OP may be defined in the pixel-defining layers PDL. Solid portions of the pixel-defining layer PDL may define spaces therebetween as the opening PDL-OP. The upper surfaces of the first electrode EL1 may be exposed to outside the pixel-defining layer PDL, at the openings PDL-OP defined in the pixel-defining layers PDL. The pixel-defining layers PDL may define the light-emitting regions PXA-B, PXA-G, and PXA-R. The light-emitting regions PXA-B, PXA-G, and PXA-R and the non-light-emitting region NPXA may be separated by the pixel-defining layers PDL. The openings PDL-OP may correspond to respective light-emitting regions.

The pixel-defining layers PDL may separate the light-emitting elements ED-1, ED-2, and ED-3 in a direction along the base layer BS. The light-emitting layers EML-1, EML-2, and EML-3 of the light-emitting elements ED-1, ED-2, and ED-3 may be disposed in the openings PDL-OP defined in the pixel-defining layers PDL, and may be separated from each other. In addition, in an embodiment, the hole transport region HTR and the electron transport region ETR of the light-emitting elements ED-1, ED-2, and ED-3 may also be disposed in the openings PDL-OP defined in the pixel-defining layers PDL.

The pixel-defining layer PDL may be formed of a polymer resin. In an embodiment, for example, the pixel-defining layer PDL may include a polyacrylate-based resin, or a polyimide-based resin. Also, the pixel-defining layer PDL may additionally include an inorganic material in addition to the polymer resin. The pixel-defining layer PDL may include a light-absorbing material, or a black pigment or black dye. The pixel-defining layer PDL including a black pigment or black dye may form a black pixel-defining layer. When the pixel-defining layer PDL is formed, carbon black or the like may be used as the black pigment or black dye, but the invention is not limited thereto.

In addition, the pixel-defining layer PDL may be formed of (or include) an inorganic material. In an embodiment, for example, the pixel-defining layer PDL may include silicon nitride (SiNx), silicon oxide (SiOx), silicon oxynitride (SiOxNy), etc.

In an embodiment, an outer surface of the pixel-defining layer PDL may be hydrophobic. In an embodiment, for example, the surface of the pixel-defining layer PDL which is not adjacent to the functional layers FL such as the hole transport region HTR, the light-emitting layers EML-1, EML-2, and EML-3, or the electron transport region ETR may define such outer surface which is hydrophobic. The upper surface of the pixel-defining layer PDL may be hydrophobic. The solid portions of the pixel-defining layer PDL may include an upper surface, and a sidewall which extends from the upper surface and defines the openings PDL-OP.

FIG. 3 illustrates an enlarged cross-sectional view of an embodiment of a portion of the display panel DP illustrated in FIG. 2, and specifically illustrates portions of adjacent light-emitting elements ED-1, ED-2, and ED-3 with a pixel-defining layer PDL which is isolated therebetween. The configuration of a respective light-emitting element illustrated in FIG. 3 represents light-emitting elements ED-1, ED-2, and ED-3 which respectively correspond to the light-emitting regions PXA-B, PXA-G, and PXA-R. While FIGS. 1 to 3 illustrate a view along the second directional axis DR2, the various structures may be applied in a view along the first directional axis DR1, without being limited thereto.

Referring to FIGS. 2 and 3, a part of the upper surface of the pixel-defining layer PDL may be exposed to outside the auxiliary electrode UCE, without overlapping the auxiliary electrode UCE. Exposed surfaces PDL-ES1 and PDL-ES2 (e.g., exposed upper surface) of the pixel-defining layer PDL may contact the second electrode EL2. The exposed surfaces PDL-ES1 and PDL-ES2, of the pixel-defining layer PDL, not overlapping the auxiliary electrode UCE, may be hydrophobic.

The widths $W_a$ and $W_b$ of the exposed surfaces PDL-ES1 and PDL-ES2 of the pixel-defining layer PDL at opposing sides of the auxiliary electrode UCE, which extend respective upper surface edges PDL-ED1 and PDL-ED2 of the pixel-defining layer PDL, to the edges of the auxiliary electrode UCE, may be each about 3 micrometers (μm) or more. When the widths $W_a$ and $W_b$ of the exposed surfaces PDL-ES1 and PDL-ES2 of the pixel-defining layer PDL not overlapping the auxiliary electrode UCE are less than about 3 μm, performing liquid-repellent treatment on the exposed upper surface of the pixel-defining layer PDL is difficult, which may cause materials to be mixed between adjacent light-emitting regions while providing the functional layers FL of the light-emitting elements ED-1, ED-2 and ED-3, or cause the functional layers FL to remain on the pixel-defining layer PDL may occur.

The display device DD may include a protective layer PP in the light-emitting element layer DP-ED. The protective layer PP may be disposed between the pixel-defining layer PDL and the first electrode EL1, and overlap the pixel-defining layer PDL.

The protective layer PP may be disposed under the pixel-defining layer PDL, and overlap at least a part of the pixel-defining layer PDL. In an embodiment, the pixel-defining layer PDL may overlap at least a part of the first electrode EL1 including the edge of the first electrode EL1, and the protective layer PP may overlap a part of the pixel-defining layer PDL overlapping the first electrode EL1.

Referring to FIGS. 2 and 3, the protective layer PP may be directly disposed between the pixel-defining layer PDL and the first electrode EL1. That is, in an embodiment, the protective layer PP may be adjacent to a side surface PDL-SS of the pixel-defining layer PDL on the lower surface of the pixel-defining layer PDL, and partially overlap the pixel-defining layer PDL. In addition, the protective layer PP may be disposed on the upper surface of the first electrode EL1, and spaced apart from the circuit layer DP-CL. The side surface PDL-SS may extend from the upper surface edges PDL-ED1 and PDL-ED2 in a direction away from the upper surface of the pixel-defining layer PDL.

A first end PP-ED1 of the protective layer PP disposed between the pixel-defining layer PDL and the first electrode EL1 may overlap the side surface PDL-SS of the pixel-defining layer PDL. On the cross-section perpendicular to the base layer BS, the first end PP-ED1 of the protective layer PP may be parallel to the extension of the side surface PDL-SS of the pixel-defining layer PDL, such that the outer surface of the protective layer PP at the first end PP-ED1 and the side surface PDL-SS are aligned or coplanar with each other. However, the invention is not limited thereto, and the first end PP-ED1 of the protective layer PP may be positioned to be shifted (e.g., spaced apart) from the side surface PDL-SS of the pixel-defining layer PDL, in a direction toward the inside of the pixel-defining layer PDL (e.g., away from the functional layers FL).

The first end PP-ED1 of the protective layer PP may be adjacent to at least one of the functional layers HTR, EML, or ETR in the opening PDL-OP of the pixel-defining layer PDL. The first end PP-ED1 of the protective layer PP may contact at least one of the functional layers HTR, EML, or ETR.

A second end PP-ED2 of the pixel-defining layer PDL which is opposite to the first end PP-ED1 may overlap an edge ELI-ED (e.g., outer edge) of the first electrode EL1 disposed on the circuit layer DP-CL. The second end PP-ED2 of the protective layer PP may contact the pixel-defining layer PDL.

The protective layer PP may be provided on the first electrode EL1, then patterned through a separate photolithography process or a photolithography process for the first electrode EL1, and a photolithography process for the pixel-defining layer PDL, and formed to overlap the lower portion of the pixel-defining layer PDL through a removing process using water.

The protective layer PP may include a water-soluble metal oxide. The protective layer PP may include a tungsten oxide ($WO_X$), or a molybdenum oxide ($MoO_X$). "X" in the tungsten oxide ($WO_X$), or the molybdenum oxide ($MoO_X$) may be 2 or more. In an embodiment, for example, the protective layer PP may include $WO_3$ as a tungsten oxide, and include $MoO_2$ or $MoO_3$ as a molybdenum oxide. However, the invention is not limited thereto.

In addition, a material of the protective layer PP may be used without limitation, as long as being a metal oxide material which is removable by being dissolved in water DI such as deionized water.

The thickness $t_{PP}$ of the protective layer PP may be less than the thickness $t_{EL1}$ of the first electrode EL1. The thickness $t_{PP}$ of the protective layer PP may be about 100 angstroms (Å) to about 200 Å. In an embodiment, for example, the thickness $t_{PP}$ of the protective layer PP may be about 150 Å to about 200 Å. The thickness $t_{EL1}$ of the first electrode EL1 may be about 700 Å to about 10000 Å. For example, the thickness $t_{EL1}$ of the first electrode EL1 may be about 1000 Å to about 3000 Å.

In a display device DD, the first electrode EL1 may be patterned on the circuit layer DP-CL. The first electrode EL1 may be patterned to correspond to each of the light-emitting regions PXA-B, PXA-G, and PXA-R. The upper surface of the first electrode EL1 may be exposed to outside the pixel-defining layer PDL by the opening PDL-OP of the pixel-defining layer PDL, and functional layers FL may be provided on the first electrode EL 1.

The first electrode EL1 may be formed of a metal material, a metal alloy, or a conductive compound. The first electrode EL1 may be an anode or a cathode. However, the invention is not limited thereto. In addition, the first electrode EL1 may be a pixel electrode.

The first electrode EL1 may be a transmissive electrode, a transflective electrode, or a reflective electrode. When the first electrode EL1 is a transmissive electrode, the first electrode EL1 may include a transparent metal oxide, for example, indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca (a stack structure of LiF and Ca), LiF/Al (a stack structure of LiF and Al), Mo, Ti, W, a compound or a combination thereof (for example, a combination of Ag and Mg). Alternatively, the first electrode EL1 may have a multilayer structure including a reflective film or a semi-transmissive film formed of a material described above, and a transmissive conductive film formed of indium tin oxide (ITO), indium zinc oxide (IZO), zinc oxide (ZnO), indium tin zinc oxide (ITZO), etc. In an embodiment, for example, the first electrode EL1 may have a three-layer structure of ITO/Ag/ITO, but is not limited thereto. In addition, the invention is not limited thereto, and the first electrode EL1 may include a metal material described above, a combination of at least two metal materials selected from the metal materials described above, oxides of the metal materials described above, or the like.

A hole transport region HTR is provided on the first electrode EL1. The hole transport region HTR may be disposed on the first electrode EL1 in the opening PDL-OP defined in a pixel-defining layer PDL. The hole transport region HTR may include at least one among a hole-injecting layer, a hole transport layer, a buffer layer or a light-emitting auxiliary layer and an electron-blocking layer. The hole transport region HTR may have a single layer composed of a single material, a single layer composed of a plurality of different materials, or a multilayer structure having a plurality of layers composed of a plurality of different materials.

In an embodiment, for example, the hole transport region HTR may have a single-layer structure of a hole-injecting layer or a hole transport layer, and a single-layer structure composed of a hole-injecting material and a hole transport material. In addition, the hole transport region HTR may have a single-layer structure composed of a plurality of different materials, or a multilayer structure having a plurality of layers sequentially stacked from the first electrode EL The hole transport region HTR may include a phthalocyanine compound such as copper phthalocyanine, $N^1,N^{1'}$-([1,1'-biphenyl]-4, 4'-diyl)bis($N^1$-phenyl-$N^4,N^4$-di-m-tolylbenzene-1,4-diamine) (DNTPD), 4,4',4"-[tris(3-methylphenyl)phenylamino] triphenylamine (m-MTDATA), 4,4'4"-tris(N,N-diphnylamino)triphenylamine (TDATA), 4,4',4"-tris[N(2-naphthyl)-N-phenylamino]-triphenylamine (2-TNATA), poly (3,4-ethylenedioxythiophene)/poly (4-styrenesulfonate) (PEDOT/PSS), polyaniline/dodecylbenzenesulfonic acid (PANI/DBSA), polyaniline/camphor sulfonicacid (PANT/CSA), polyaniline/poly(4-styrenesulfonate) (PANT/PSS), N,N'-di(naphthalene-1-yl)-N,N'-diphenylbenzidine (NPB), polyetherketone containing triphenylamine (TPAPEK), 4-Isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may include a carbazole-based derivative such as N-phenylcarbazole and polyvinylcarbazole, a fluorene-based derivative, triphenylamine-based derivative such as N,N'-bis(3-methylphenyl)-N,N'-diphenyl[1,1'-biphenyl]-4,4'-diamine (TPD), and 4,4',4"-tris (N-carbazolyl)triphenylamine (TCTA), N,N'-di (naphthalene-1-yl)-N,N'-diphenyl-benzidine (NPB), 4,4'-Cyclohexylidene bis[N,N-bis(4-methylphenyl) benzenamine] (TAPC), 4,4'-Bis[N,N'-(3-tolyl)amino]-3,3'-dimethy lbiphenyl (HMTPD), 1,3-Bis(N-carbazolyl) benzene (mCP), etc.

The aforementioned material of the hole transport region HTR may be provided on the first electrode EL1 through inkjet printing (e.g., inkjet-printed hole transport layer). The hole transport region HTR may be formed to be disposed in the opening PDL-OP of the pixel-defining layer PDL by using inkjet printing.

The light-emitting layer EML may be disposed on the hole transport region HTR, and disposed in the opening PDL-OP defined in the pixel-defining layer PDL. That is, the light-emitting layer EML may be separately formed to correspond to light-emitting regions PXA-B, PXA-G, and PXA-R separated by the pixel-defining layer PDL. When the light-emitting layers EML are separately formed in the respective openings PDL-OP, each of the light-emitting layers EML-1, EML-2, and EML-3 may emit light having at least one of blue, red, or green color.

In an embodiment, the light-emitting layer EML may include a florescent or phosphorescent material that emits light of red, green, or blue color. In addition, the light-emitting layer EML may include a metal organic complex as a light-emitting material. The light-emitting layer EML may include quantum dot as a light-emitting material.

The material of the light-emitting layer EML may be provided on the hole transport region HTR through using inkjet printing. (e.g., inkjet-printed light-emitting layer). The light-emitting layer EML may be formed to be disposed in the opening PDL-OP of the pixel-defining layer PDL by using inkjet printing.

The electron transport region ETR is provided on the light-emitting layer EML. The electron transport region ETR may include at least one of a hole-blocking layer, an electron transport layer, or an electron-injecting layer, but the invention is not limited thereto. The electron transport region ETR may have a single layer composed of a single material, a single layer composed of a plurality of different materials, or a multilayer structure having a plurality of layers composed of a plurality of different materials.

In an embodiment, for example, the electron transport region ETR may have a single-layer structure of an electron-injecting layer or an electron transport layer, and may also have a single-layer structure composed of an electron-injecting material and an electron transport material. In addition, the electron transport region ETR may have a single-layer structure composed of a plurality of different materials, or a multilayer structure having a plurality of layers sequentially stacked from the light-emitting layer EML.

The electron transport region ETR may include an anthracene-based compound. However, the invention is not limited thereto, and for example, the electron transport region ETR may include tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (ADN), 1,3-bis[3,5-di(pyridin-3-yl)phenyl]benzene (BmPyPhB), diphenyl(4-(triphenylsilyl)phenyl)phosphine oxide (TSPO1), and a combination thereof.

In addition, the electron transport region ETR may include a metal oxide such as Li$_2$O, and BaO, 8-hydroxyl-Lithium quinolate (Liq), or the like, but the invention is not limited thereto. The electron transport region ETR may be also composed of a material in which an electron transport material and an insulative organo metal salt are mixed. The organo metal salt may have an energy band gap of about 4 electron volts (eV) or more. In an embodiment, for example, the organo metal salt may include metal acetate, metal benzoate, metal acetoacetate, metal acetylacetonate, or metal stearate.

In addition to the above-mentioned materials, the electron transport region ETR may further include at least one of 2,9-dimethyl-4,7-diphenyl-1,10-phenanthroline (BCP), or 4,7-diphenyl-1,10-phenanthroline (Bphen).

The aforementioned material of the electron transport region ETR may be provided on the light-emitting layer EML using inkjet printing (e.g., inkjet-printed electron transport layer). The electron transport region ETR may be disposed in the opening PDL-OP of the pixel-defining layer PDL by using inkjet printing.

The second electrode EL2 is provided on the electron transport region ETR. The second electrode EL2 may be a common electrode. The second electrode EL2 may be a cathode or an anode, but the invention is not limited thereto. In an embodiment, for example, when the first electrode EL1 is an anode, the second electrode EL2 may be a cathode; and when the first electrode EL1 is a cathode, the second electrode EL2 may be an anode. The second electrode EL2 may include at least one selected from Ag, Mg, Cu, Al, Pt, Pd, Au, Ni, Nd, Ir, Cr, Li, Ca, LiF, Mo, Ti, W, In, Sn, or Zn, a combination of at least two selected thereamong, or an oxide thereof.

The second electrode EL2 may be a transmissive electrode, a transflective electrode, or a reflective electrode. When the second electrode EL2 is a transmissive electrode, the second electrode EL2 may be composed of a transparent metal oxide such as indium tin oxide (ITO), indium zinc oxide (IZO), zinc oxide (ZnO), and indium tin zinc oxide (ITZO).

When the second electrode EL2 is a transflective electrode, or a reflective electrode, the second electrode EL2 may include Ag, Mg, Cu, Al, Pt, Pd, Au, Ni, Nd, Ir, Cr, Li, Ca, LiF/Ca(a stack structure of LiF and Ca), LiF/Al(a stack structure of LiF and Al), Mo, Ti, Yb, W, a compound containing the same, or a combination thereof (for example, AgMg, AgYb, or MgYb). In addition, the second electrode EL2 may have a multilayer structure including a reflective film or a transflective film formed of the aforementioned materials, and a transparent conductive film formed of indium tin oxide (ITO), indium zinc oxide (IZO), zinc oxide (ZnO), indium tin zinc oxide (ITZO), etc. In an embodiment, for example, the second electrode EL2 may include the aforementioned metal material, a combination of at least two metal materials selected from the aforementioned metal materials, oxides of the aforementioned metal materials, or the like.

The second electrode EL2 may be electrically connected to the auxiliary electrode UCE. The second electrode EL2 may be disposed directly on the auxiliary electrode UCE. When the second electrode EL2 is connected to the auxiliary electrode UCE, the resistance of the second electrode EL2 may decrease.

The auxiliary electrode UCE may include a metal material such as Al, Mo, Cu, and Ag, or an alloy material of a combination of at least two selected from among such metal materials. The thickness of the auxiliary electrode UCE may be about 500 Å or more. Since the thickness of the auxiliary electrode UCE is about 500 Å or more, the second electrode EL2 may cover the auxiliary electrode UCE favorably, and the resistance reduction effect of the second electrode EL2 may be excellent.

The auxiliary electrode UCE may be provided by being patterned on the pixel-defining layer PDL. The auxiliary electrode UCE may be formed to extend along the extension direction of the pixel-defining layer PDL on the pixel-defining layer PDL.

In an embodiment, the display panel DP may include an encapsulation layer TFE that covers the light-emitting element layer DP-ED. The encapsulation layer TFE may include a structure of an inorganic layer/an organic layer/an inorganic layer, which are sequentially stacked, but layers constituting the encapsulation layer TFE are not limited thereto.

Inorganic layers of the encapsulation layer TFE may protect the light-emitting element layer DP-ED from moisture and oxygen, and organic layers thereof may protect the light-emitting element layer DP-ED from foreign matters such as dust particles. The inorganic layers may include a silicon nitride layer, a silicon oxynitride layer, a silicon oxide layer, a titanium oxide layer, an aluminum oxide layer, or the like. The organic layers may include an acrylic organic layer, but the invention is not limited thereto.

The display device DD may exhibit improved light-emitting efficiency characteristics and reliability characteristics by including the auxiliary electrode UCE disposed on the pixel-defining layer PDL to reduce the resistance (e.g., electrical resistance) of the second electrode EL2. In addition, since one or more embodiment of the display device DD includes, during a manufacturing process, the protective layer PP which is provided on the first electrode EL1 and remains to overlap at least a part of the pixel-defining layer PDL under the pixel-defining layer PDL after being partially removed, the coating characteristics and adhesion of functional layers HTR, EML, and ETR in the opening PDL-OP are improved, whereby the display device DD exhibits the effect of improving display quality and reliability.

Figure 4:
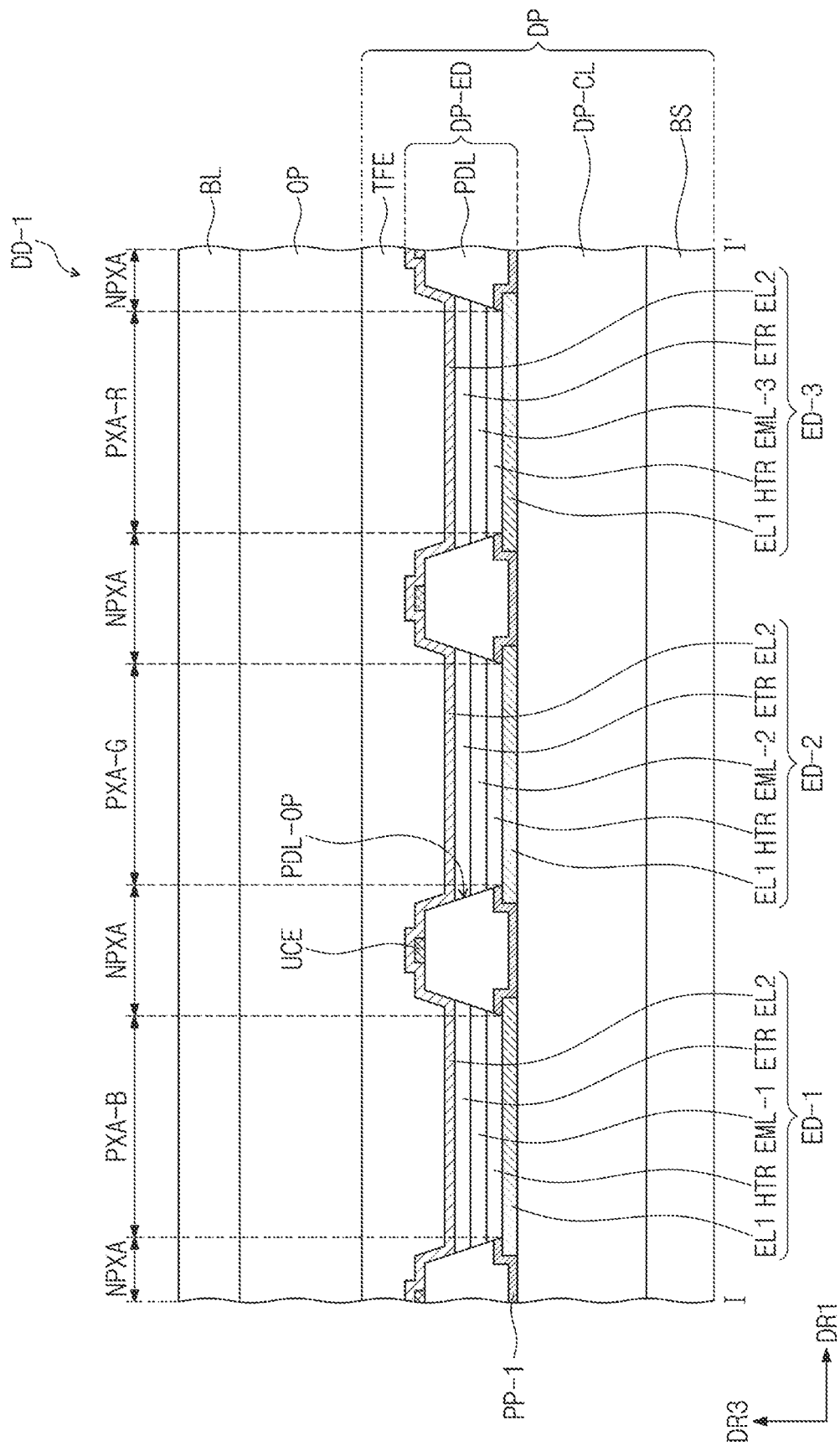
FIG. 4 is a cross-sectional view of an embodiment of a display device.
Figure 5:
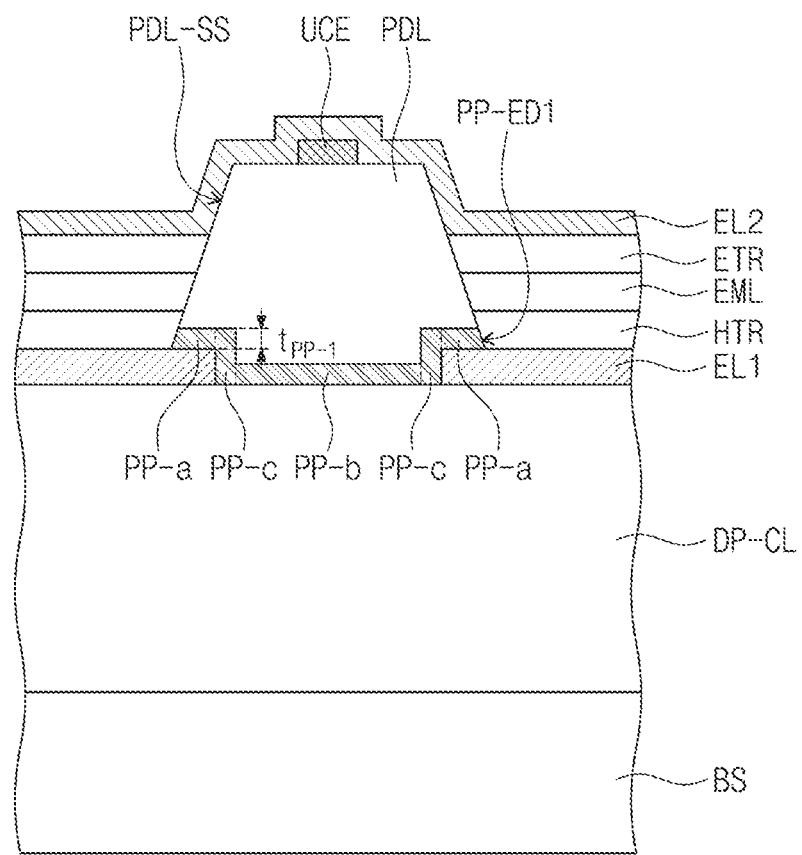
FIG. 5 is a cross-sectional view of an embodiment of a display device.

FIG. 4 is a cross-sectional view of an embodiment of a display device DD-1, and FIG. 5 is a cross-sectional view showing an embodiment of a portion of a display device DD-1. FIG. 4 may be a part taken along line I-I' in FIG. 1. In the description of a display device DD-1 in FIGS. 4 and 5, the duplicate description made with reference to FIGS. 1 to 3 will not be described again, and description will be focused on different points.

Referring to FIGS. 4 and 5, a display device DD-1 may include a protective layer PP-1 overlapping an entirety of a pixel-defining layer PDL. In an embodiment, the protective layer PP-1 may include a first portion PP-a disposed between a first electrode EL1 and the pixel-defining layer PDL, a second portion PP-b disposed between a circuit layer DP-CL and the pixel-defining layer PDL and not overlapping the first electrode EL1, and a third portion PP-c disposed between the first portion PP-a and the second portion PP-b and connecting the first portion PP-a to the second portion PP-b. The first portion PP-a, the second portion PP-b, and the third portion PP-c may be integrally formed. That is, the first portion PP-a may extend from between the first electrode EL1 and the pixel-defining layer PDL, along the sidewall of the first electrode EL1 at the edge EL1-ED thereof to define the third portion PP-c, and along the circuit layer DP-CL in a direction away from the third portion PP-c to define the second portion PP-b between the circuit layer DP-CL and the pixel-defining layer PDL.

In an embodiment, the protective layer PP-1 may include a water-soluble metal oxide. A first end PP-ED1 of the protective layer PP-1 may overlap a side surface PDL-SS of the pixel-defining layer PDL. On a cross-section perpendicular to a base layer BS, the first end PP-ED1 of the protective layer PP-1 may be parallel to an extension surface of the side surface PDL-SS of the pixel-defining layer PDL. However, the invention is not limited thereto, and the first end PP-ED1 of the protective layer PP-1 may be positioned to be shifted in a direction along the circuit layer DP-CL from a side surface PDL-SS of the pixel-defining layer PDL, toward the inside of the pixel-defining layer PDL.

The first end PP-ED1 of the protective layer PP-1 may be adjacent to (e.g., closest to) at least one of functional layers HTR, EML, or ETR in the opening PDL-OP of the pixel-defining layer PDL. The first end PP-ED1 of the protective layer PP-1 may contact a sidewall of at least one of the functional layers HTR, EML, or ETR, in the opening PDL-OP.

In an embodiment, a material layer for forming the protective layer PP-1 may be provided on the circuit layer DP-CL while covering the first electrode EL1, then patterned through a photolithography process during forming of the pixel-defining layer PDL, to provide the protective layer PP-1 as a pattern of the material layer through a removing process using water.

The display device DD-1 may exhibit improved light-emitting efficiency characteristics and reliability characteristics by including an auxiliary electrode UCE disposed on the pixel-defining layer PDL to reduce the resistance of the second electrode EL2. In addition, since the display device DD-1 includes the protective layer PP-1 which is provided to cover the first electrode EL1 during a manufacturing process, and remains to be disposed under the pixel-defining layer PDL by being patterned during forming of the pixel-defining layer PDL, the coating characteristics and adhesion of functional layers HTR, EML, and ETR in the opening PDL-OP are improved, whereby the display device DD-1 exhibits the effect of improving display quality and reliability. In addition, in a manufacturing process of the display device DD-1, when the protective layer PP-1 is provided to overlap the entirety of the pixel-defining layer PDL, a process for separately patterning the protective layer PP-1 may be omitted.

Hereinafter, a manufacturing method of a display device DD (e.g., method of providing the display device DD) will be described with reference to FIGS. 6 to 8H. In the description with reference to FIGS. 6 to 8H, the duplicate description made with reference to FIGS. 1 to 5 described above will not be described again, and description will be focused on different points.

Figure 6:
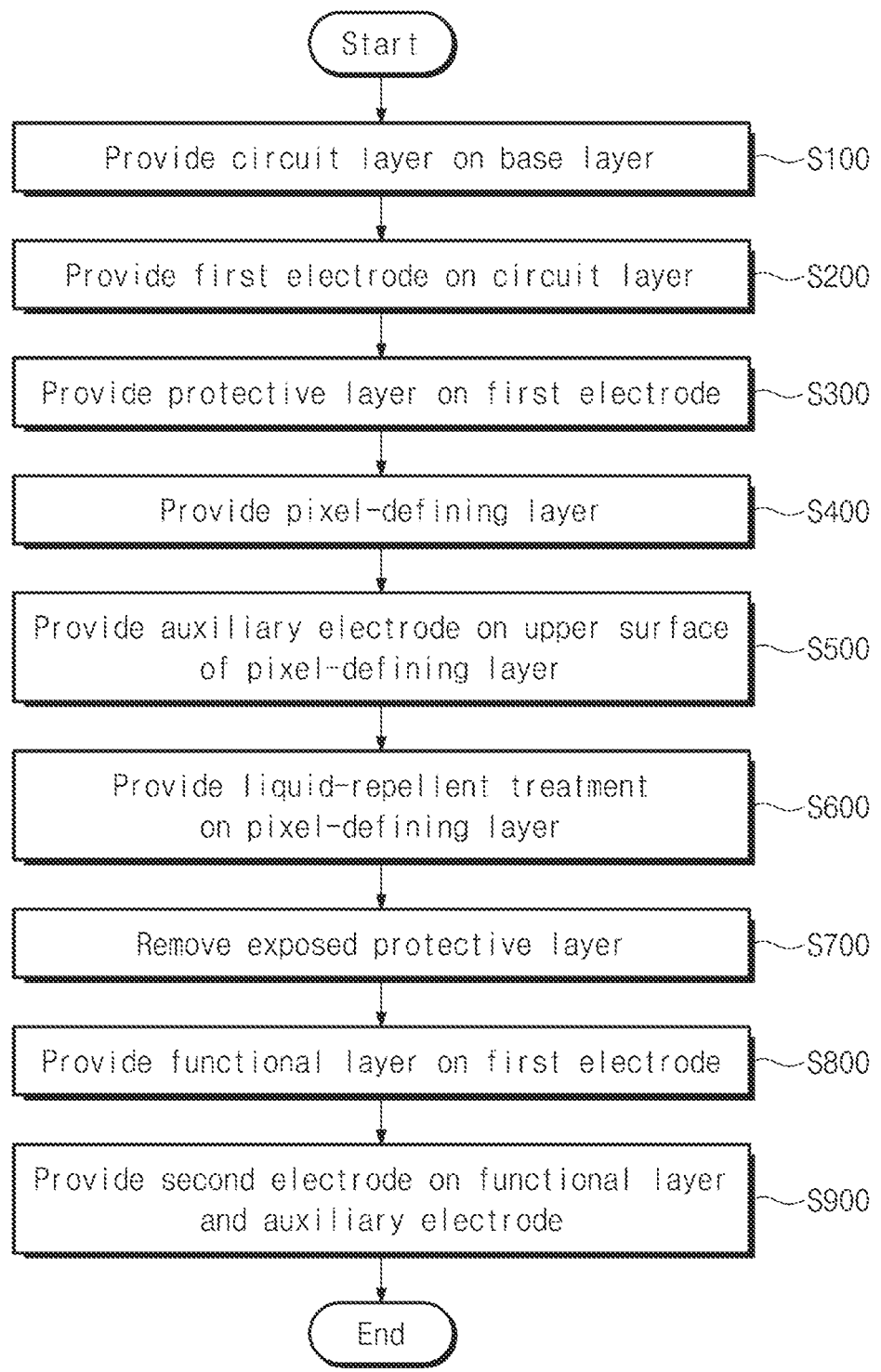
FIG. 6 is a flowchart illustrating an embodiment of a method of providing a display device.

FIG. 6 is a flowchart illustrating an embodiment of a manufacturing method of a display device DD. FIGS. 7A to 7H are diagrams schematically illustrating embodiments of operations of a manufacturing method of a display device DD. In addition, FIGS. 8A to 8H are diagrams schematically illustrating embodiments of operations of a manufacturing method of a display device DD-1. FIGS. 7A to 7H exemplarily illustrate an embodiment of a manufacturing method of the display device DD having a structure illustrated in FIGS. 2 and 3, and FIGS. 8A to 8H exemplarily illustrate an embodiment of a manufacturing method of the display device DD-1 having a structure illustrated in FIGS. 4 and 5.

Referring to FIG. 6, an embodiment of a method of providing a display device DD may include an operation (S100) of forming (or providing) a circuit layer DP-CL on a base layer BS, an operation (S200) of providing a first electrode EL1 of a light-emitting element on the circuit layer DP-CL, an operation (S300) of providing a protective layer PP on the first electrode EL1, an operation (S400) of forming a pixel-defining layer PDL, an operation (S500) of forming an auxiliary electrode UCE on an upper surface of the pixel-defining layer PDL, an operation (S600) of performing a liquid-repellent treatment on the pixel-defining layer PDL, an operation (S700) of removing the exposed protective layer, an operation (S800) of providing functional layers FL on the first electrode EL1, and an operation (S900) of providing a second electrode EL2 on the functional layers FL and the auxiliary electrode UCE.

The operation (S100) of forming the circuit layer DP-CL on the base layer BS may include providing materials of an insulating layer, a semiconductor layer, and a conductive layer through coating, deposition, etc., and then selectively patterning the insulating layer, the semiconductor layer, and the conductive layer, such as by performing a photolithography process multiple times on the respective layers. After such a patterning process, a circuit layer DP-CL including a semiconductor pattern, a conductive pattern, a signal line, etc., may be formed.

In the operation (S200) of providing the first electrode EL1 on the circuit layer DP-CL, first electrodes EL1 may be patterned so as to be spaced apart from each other along the circuit layer DP-CL. The first electrode EL1 may be formed by provide a metal material, a metal alloy, or a conductive compound as a preliminary first electrode material layer and patterning such material layer to provide the first electrodes EL1. Each first electrode EL1 may have outer edges (e.g., edge EL1-ED) opposing each other along the circuit layer DP-CL.

Figure 7A:
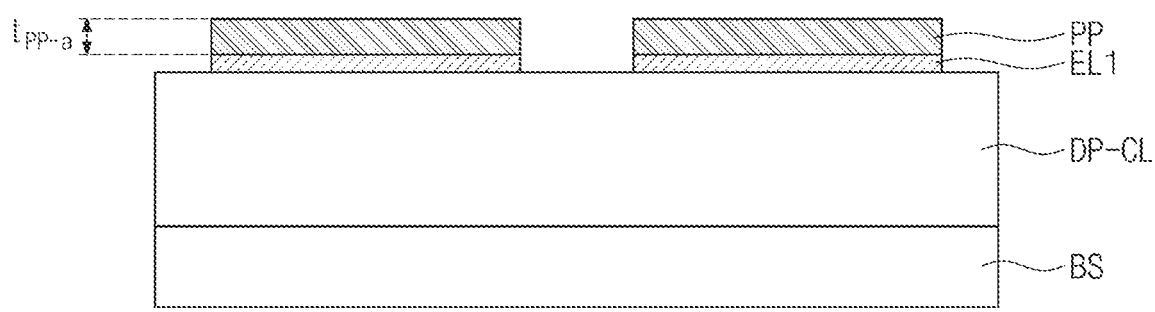
FIGS. 7A to 7H are diagrams schematically illustrating operations of an embodiment of a method providing a display device.
Figure 8A:
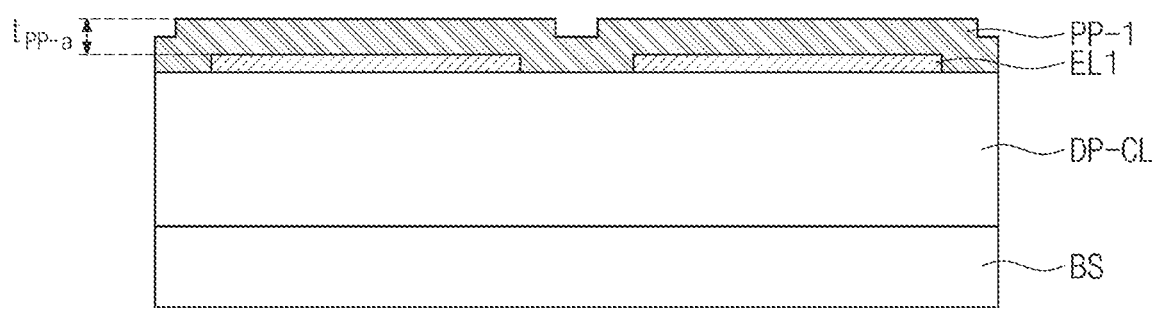
FIGS. 8A to 8H are diagrams schematically illustrating operations of an embodiment of a display device.

The operation (S300) of providing the protective layer PP or PP-1 on the first electrode EL1 may be performed after the operation (S200) of providing the first electrode EL1 on the circuit layer DP-CL. FIGS. 7A and 8A are diagrams exemplarily illustrating the operation (S300) of providing the protective layer PP or PP-1 on the first electrode EL1, respectively.

Referring to FIG. 7A, a preliminary protective material layer (labeled as protective layer PP) may be provided on the first electrode EL1 so as to correspond to the shape of the first electrode EL1 in cross-section.

In addition, referring to FIG. 8A, a preliminary protective material layer (labeled as protective layer PP-1) may be provided so as to overlap an entirety of the circuit layer DP-CL, while covering the first electrode EL1. That is, the operation (S300) of providing the protective layer PP or PP-1 on the first electrode EL1 may include providing the preliminary protective material layer on the circuit layer DP-CL, to cover the first electrodes EL1.

The protective layer PP or PP-1 includes a water-soluble metal oxide, and for example, may include a tungsten oxide or a molybdenum oxide.

In the operation (S300) of providing the protective layer PP on the first electrode illustrated in FIG. 7A, a preliminary thickness $t_{PP\text{-}a}$ of the protective layer PP disposed on the first electrode EL1, may be greater than the thickness $t_{PP}$ of the protective layer PP in the display device DD of FIGS. 2 and 3 provided by one or more embodiment of the method of providing a display device DD. In the operation (S300) of providing the protective layer PP on the first electrode EL1, the preliminary thickness $t_{PP\text{-}a}$ of the protective layer PP disposed on the first electrode EL1, may be about two to about three times of the thickness $t_{PP}$ of the protective layer PP in the display device DD which is finally provided.

In addition, in the operation (S300) of providing the protective layer PP-1 on the first electrode EL1, with references to FIG. 8A, the preliminary thickness $t_{PP\text{-}a}$ of the protective layer PP-1 disposed on the first electrode EL1 may be also greater than the thickness $t_{PP\text{-}1}$ of the protective layer PP-1 in the display device DD-1 in FIGS. 4 and 5 provided by one or more embodiment of the method of providing a display device DD-1. In the operation (S300) of providing the protective layer PP-1 on the first electrodes EL1, the preliminary thickness $t_{PP\text{-}a}$ of the protective layer PP-1 disposed on the first electrode EL1 may be about two to about three times of the thickness $t_{PP\text{-}1}$ of the protective layer PP-1 in the display device DD-1 which is finally formed.

In the operation (S300) of providing the protective layer PP or PP-1 on the first electrode EL1 exemplarily illustrated in FIGS. 7A or 8A, the preliminary thickness $t_{PP\text{-}a}$ of the protective layer PP or PP-1 disposed on the first electrode EL1 may be reduced during a photolithography process performed in manufacturing operations of a display device DD to be performed later. That is, the preliminary thickness $t_{PP\text{-}a}$ of the protective layer PP or PP-1 provided in the operation (S300) of providing the protective layer PP or PP-1 on the first electrode EL1 may be sufficient to be capable of covering the first electrode EL1, etc., while the photolithography processes performed when forming the pixel-defining layer PDL and the auxiliary electrode UCE is being performed.

After the operation (S300) of providing the protective layer PP or PP-1 on the first electrode EL1, the operation (S400) of forming the pixel-defining layer PDL may be performed. The operation (S400) of forming the pixel-defining layer PDL may include forming the pixel-defining layer PDL in which an opening PDL-OP is defined to expose the upper surface of the preliminary protective material layer (e.g., exposed upper surface). The pixel-defining layer PDL may be patterned to define the opening PDL-OP by a photolithography process.

Figure 7B:
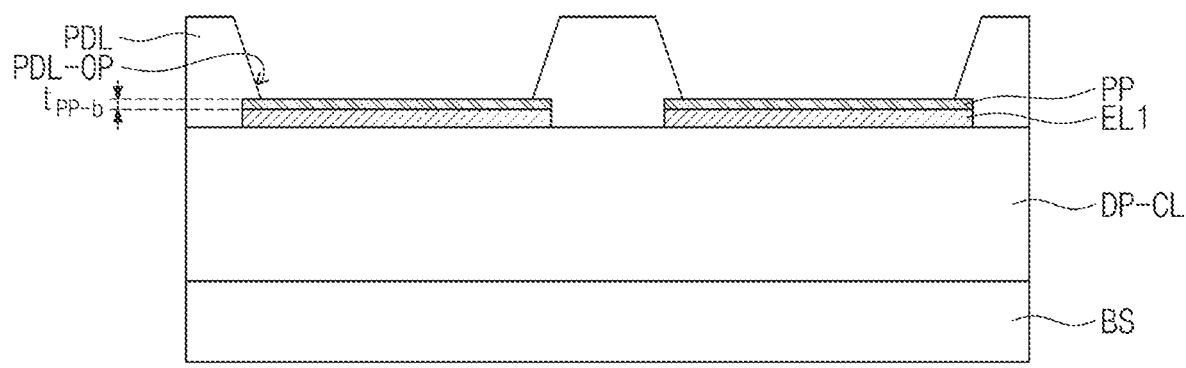
Figure 8B:
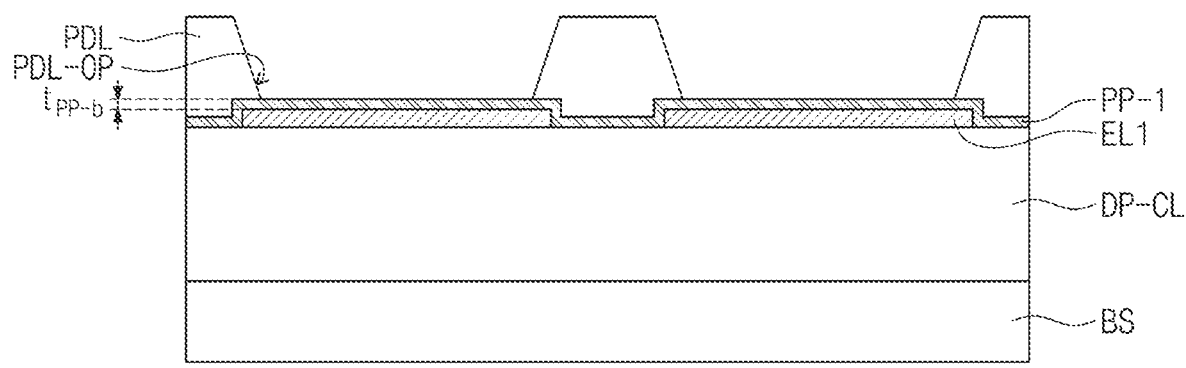

FIGS. 7B and 8B are diagrams exemplarily illustrating the operation (S400) of forming the pixel-defining layer PDL, respectively. In the operation (S400) of forming the pixel-defining layer PDL, the opening PDL-OP may be defined, and the upper surface of the protective layer PP or PP-1 may be exposed to outside the pixel-defining layer PDL in the opening PDL-OP.

Referring to FIG. 7B, the protective layer PP may correspond to the shape of the first electrode EL1, a central part of the upper surface of the protective layer PP may be exposed to outside the pixel-defining layer PDL in the opening PDL-OP, and the edge part of the protective layer PP may overlap the pixel-defining layer PDL. The protective layer PP exposed in the opening PDL-OP may cover the first electrode EL1.

In addition, referring to FIG. 8B, the protective layer PP-1 may cover the first electrode EL1, and may overlap an entirety of the pixel-defining layer PDL. That is, the operation (S400) of forming the pixel-defining layer PDL may include patterning of a preliminary pixel-defining material layer which forms the pixel-defining layer PDL, so that the pixel-defining layer PDL overlaps an entirety of the protective layer PP-1. Referring to FIG. 8B, in the opening PDL-OP, a part of the upper surface of the protective layer PP-1 may be exposed to outside the pixel-defining layer PDL, and a remaining portion of the protective layer PP-1 may overlap the pixel-defining layer PDL. The protective layer PP-1 may cover the first electrode EL1, and at an area not overlapping the first electrode EL1, the protective layer PP-1 may be disposed directly between the pixel-defining layer PDL and the circuit layer DP-CL and extended along a lower surface of the pixel-defining layer PDL.

The thickness $t_{PP-b}$ of the protective layer PP or PP-1 after the operation (S400) of forming the pixel-defining layer PDL may be smaller than the preliminary thickness $t_{PP-a}$ provided in the operation (S300) of providing the protective layer PP or PP-1 on the first electrode EL1. In addition, the thickness $t_{PP-b}$ of the protective layer PP or PP-1 after the operation (S400) of forming the pixel-defining layer PDL may be equal to or less than the preliminary thickness $t_{PP-a}$ provided in the operation (S300) of providing the protective layer PP or PP-1 on the first electrode EL1, and may be equal to or greater than the thickness $t_{PP}$ and $t_{PP-1}$ of the protective layer PP or PP-1 in the manufactured display devices DD and DD-1.

Figure 7C:
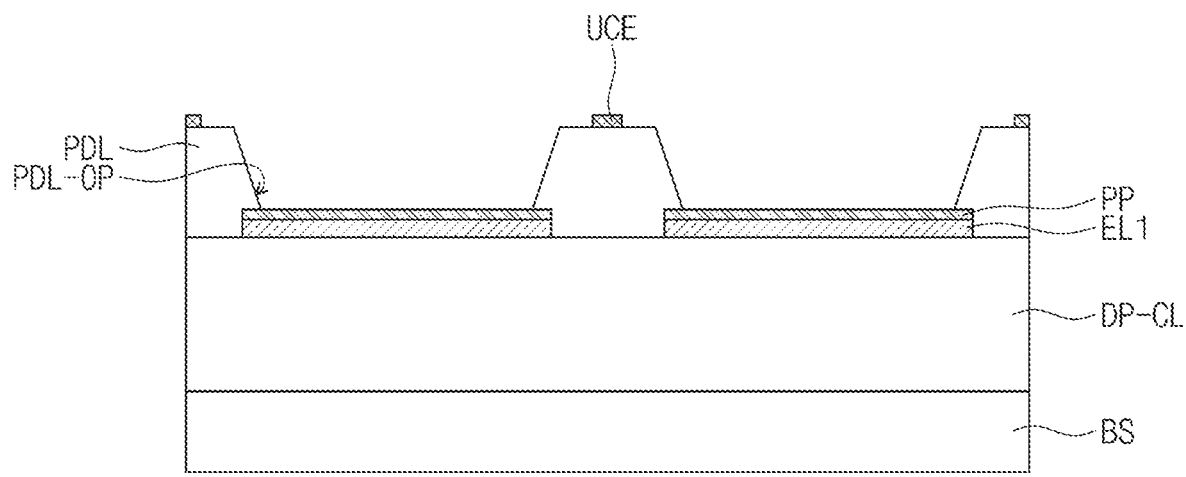
Figure 8C:
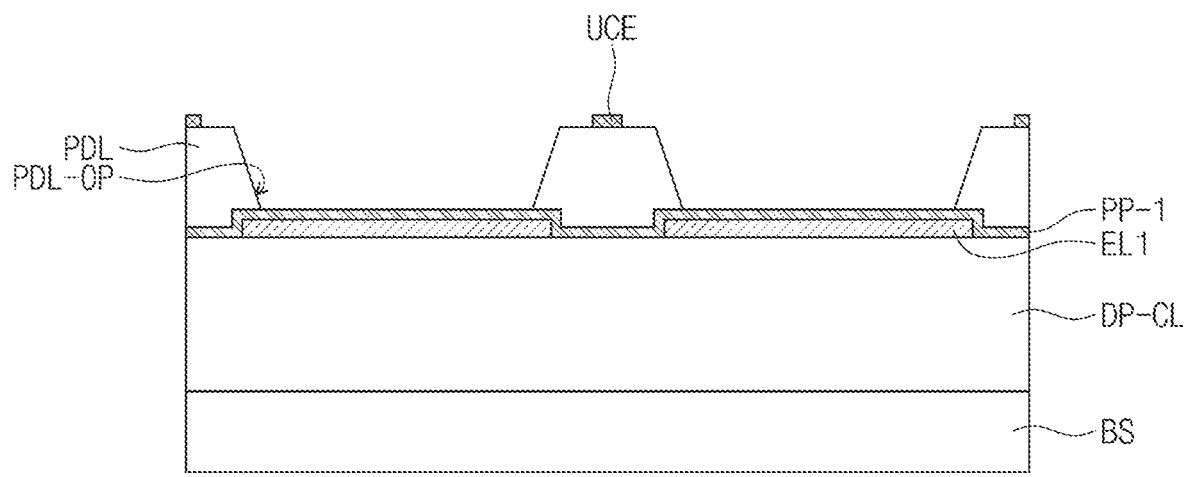

After the operation (S400) of forming the pixel-defining layer PDL, the operation (S500) of forming the auxiliary electrode UCE on the upper surface of the pixel-defining layer PDL may be performed. FIGS. 7C and 8C are diagrams exemplarily illustrating the operation (S500) of forming the auxiliary electrode on the upper surface of the pixel-defining layer PDL, respectively.

The auxiliary electrode UCE may be formed on the upper surface of the pixel-defining layer PDL. The auxiliary electrode UCE may be patterned from an auxiliary electrode material layer, to expose at least a part of the upper surface of the pixel-defining layer PDL. The auxiliary electrode UCE may be positioned on the central part of the pixel-defining layer PDL, and the upper surface of the pixel-defining layer PDL which does not overlap the auxiliary electrode UCE, may be exposed to outside the auxiliary electrode UCE at a location around the auxiliary electrode UCE. On a cross-section perpendicular to the base layer BS, the width Wa or Wb of the upper surface of the pixel-defining layer PDL at one side of the auxiliary electrode UCE, which is exposed without overlapping the auxiliary electrode UCE, may be about 3μm or more, respectively.

The manufacturing method of a display device DD or DD-1 may include the operation (S600) of performing a liquid-repellent treatment on the pixel-defining layer PDL performed after the operation (S500) of forming the auxiliary electrode UCE on the upper surface of the pixel-defining layer PDL. The operation (S600) of performing the liquid-repellent treatment on the pixel-defining layer PDL may be performed to modify the exposed surface of the pixel-defining layer PDL so that an ink material IK-F (e.g., materials forming the functional layers FL) having a relatively hydrophilic property, may be separated from each other by solid portions of the pixel-defining layer PDL, and positioned only inside the opening PDL-OP.

Figure 7D:
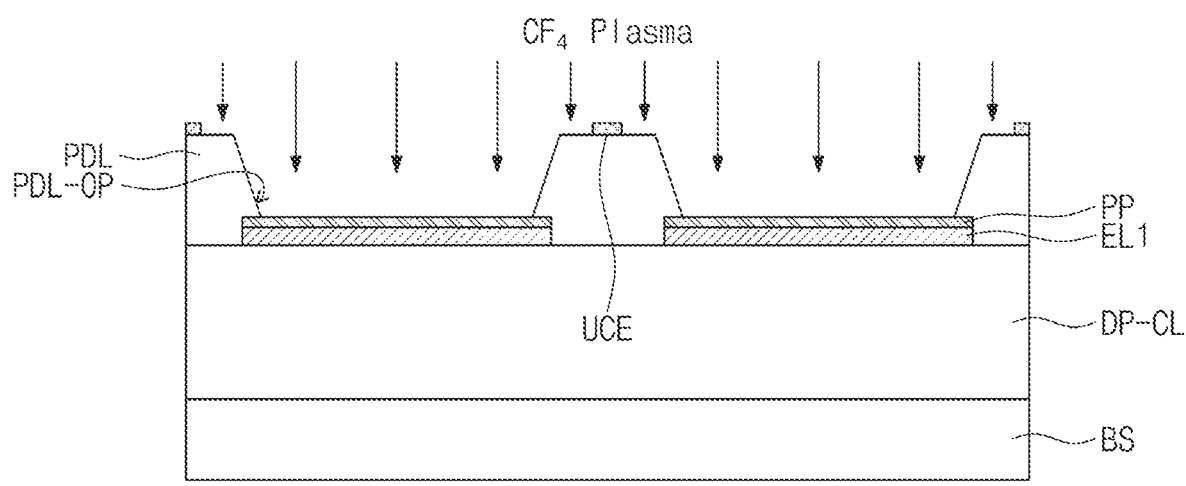
Figure 8D:
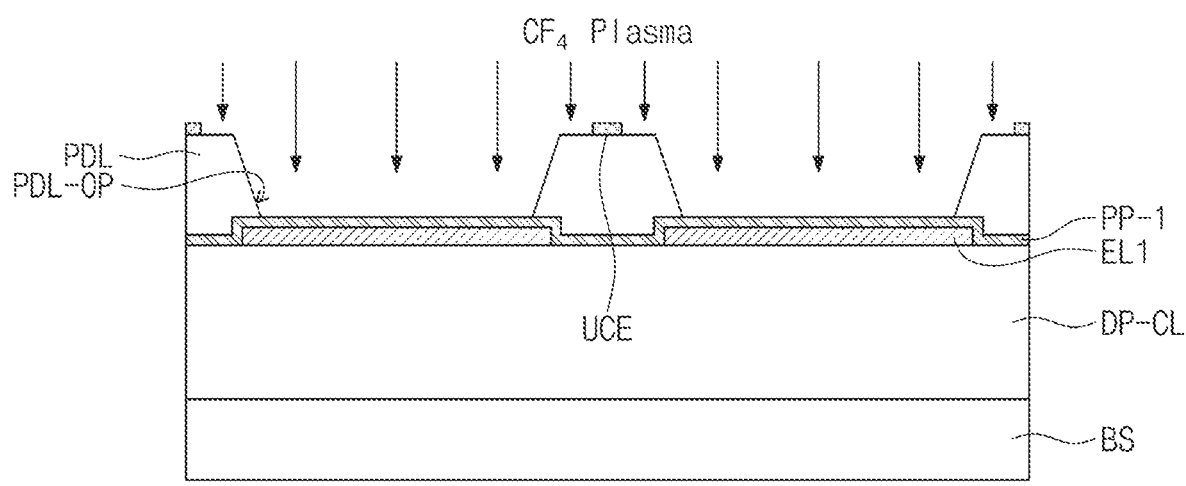

FIGS. 7D and 8D are diagrams exemplarily illustrating the operation (S600) of performing the liquid-repellent treatment on the pixel-defining layer PDL. The operation (S600) of performing the liquid-repellent treatment on the pixel-defining layer PDL may include treating the pixel-defining layer PDL with $CF_4$ plasma to impart a hydrophobic property to exposed surfaces of the pixel-defining layer PDL (e.g., hydrophobic treatment).

Referring to FIGS. 7D and 8D, the exposed surface of the pixel-defining layer PDL may be modified by supplying $CF_4$ plasma to the pixel-defining layer PDL from above. The exposed surface of the pixel-defining layer PDL may have a hydrophobic property through CF4 plasma treatment. The exposed surface as a portion of the upper surface and side surfaces of the pixel-defining layer PDL, may have a hydrophobic property through $CF_4$ plasma treatment.

Figure 7E:
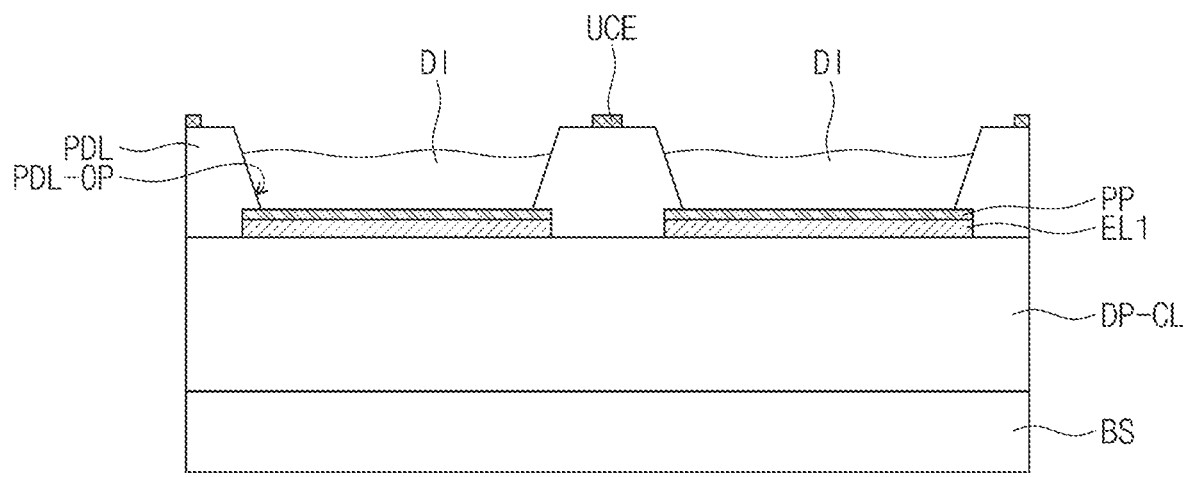
Figure 8E:
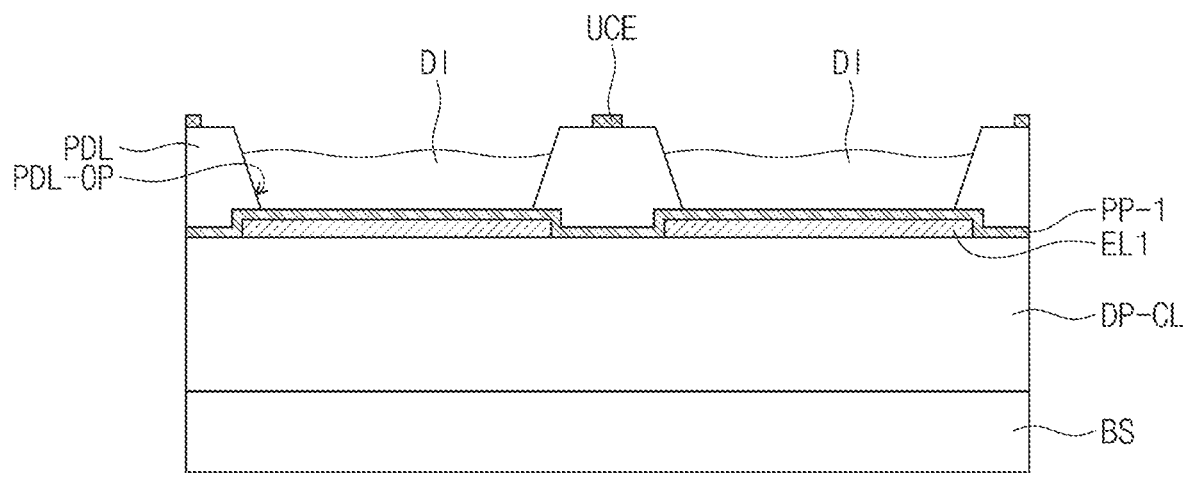

The manufacturing method of a display device DD or DD-1 may include the operation (S700) of removing the exposed portion of the protective layer PP or PP-1. FIGS. 7E and 8E are diagrams exemplarily illustrating the operation (S700) of removing the exposed portion of the protective layer PP or PP-1.

The operation (S700) of removing the exposed portion of the protective layer PP or PP-1 may include removing, with water DI, a portion of the protective layer PP or PP-1 which is exposed outside the pixel-defining layer PDL which has the hydrophobic surfaces, in the opening PDL-OP. The water DI used for removing portions of the protective layer PP or PP-1 may be deionized water, but the invention is not limited thereto. The operation (S700) of removing the exposed portion of the protective layer PP or PP-1 with water DI may be an operation of cleaning the components of a display device DD or DD-1 with water DI which has undergone the liquid-repellent treatment and includes hydrophobic surfaces.

The water DI may be provided to sufficiently cover the protective layer PP or PP-1 disposed in the opening PDL-OP, after performing the liquid-repellent treatment on the pixel-defining layer PDL. In addition, the water DI may be provided on the pixel-defining layer PDL to sufficiently clean not only the inside of the opening PDL-OP but also outer surfaces of the pixel-defining layer PDL, the auxiliary electrode UCE, etc. A display device DD or DD-1 in the manufacturing process may be dipped into the water DI for cleaning.

The protective layer PP or PP-1 provided in one or more embodiment is water-soluble, and may thus be removed at a thickness reduction speed of about 50 angstroms per minute (Å/min) to about 100 Å/min when the water DI is sufficiently provided. The protective layer PP or PP-1 may be sequentially removed in a direction from the exposed upper surface of the protective layer PP or PP-1. In the operation (S700) of removing the exposed portion of the protective layer PP or PP-1 (e.g., exposed protective layer), the entirety of the portion of the protective layer PP or PP-1 which is exposed in the opening PDL-OP may be removed by using water DI.

Figure 7F:
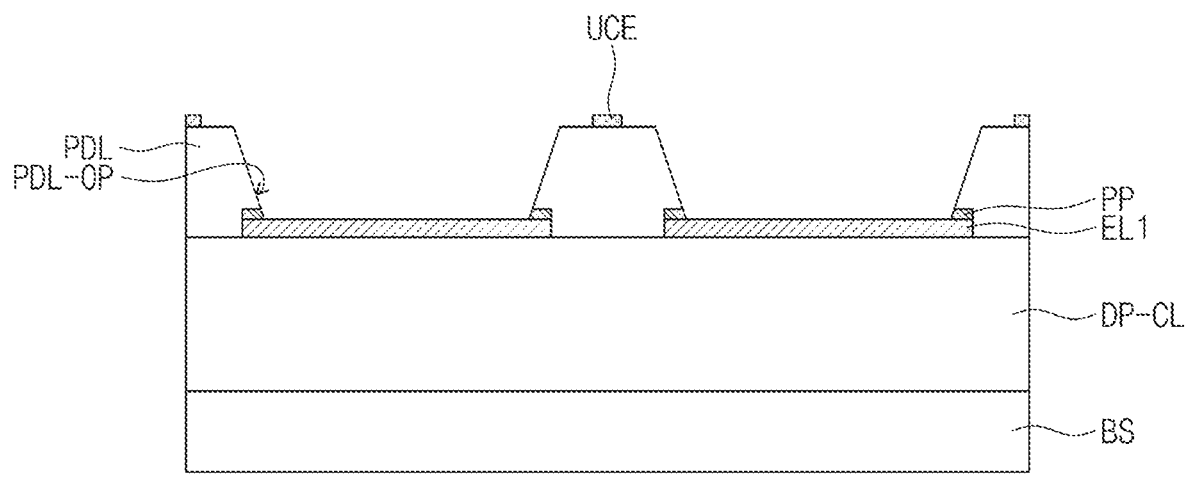
Figure 8F:
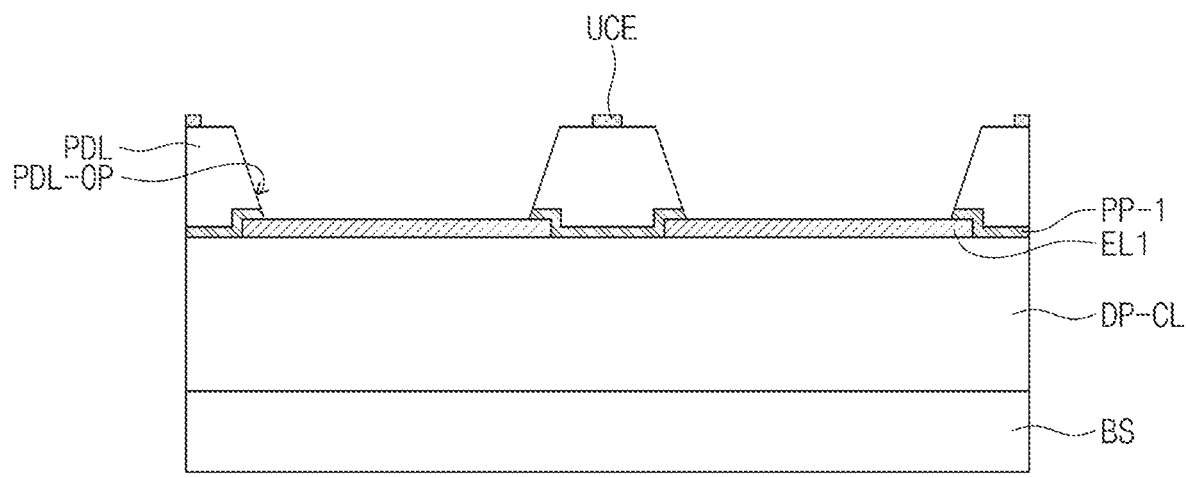

FIGS. 7F and 8F are diagrams exemplarily illustrating a stacked structure after the operation (S700) of removing the exposed portion of the protective layer PP or PP-1. After removing the protective layer PP or PP-1 at the expose portion thereof, the upper surface of the first electrode EL1 may be exposed to outside the pixel-defining layer PDL at the opening PDL-OP of the pixel-defining layer PDL. One edge of the protective layer PP or PP-1 may overlap or be aligned with the side surface PDL-SS of the pixel-defining layer PDL, but the invention is not limited thereto. After the operation (S700) of removing the exposed protective layer, the one edge of the protective layer PP or PP-1 may be exposed to outside the pixel-defining layer PDL.

After sequentially performing the operation (S600) of performing the liquid-repellent treatment on the pixel-defining layer PDL, and the operation (S700) of removing the exposed protective layer, the upper surface of the pixel-defining layer PDL and the upper surface of the first electrode EL1 may exhibit different surface characteristics. The upper surface of the pixel-defining layer PDL may be more hydrophobic than the upper surface of the first electrode EL1, and the upper surface of the first electrode EL1 exposed to outside the pixel-defining layer PDL in the opening PDL-OP of the pixel-defining layer PDL may exhibit a relatively hydrophilic property as compared to the upper surface of the pixel-defining layer PDL.

After the operation (S700) of removing the exposed protective layer, the contact angle of methylethylbenzoate on the upper surface of the pixel-defining layer PDL is about 60 degrees (°) or more, and the contact angle of methylethylbenzoate on the upper surface of the upper surface of the first electrode EL1 is about 5° or less. That is, the upper surface of the pixel-defining layer PDL may exhibit a hydrophobic property, and the upper surface of the first electrode EL1 may exhibit a hydrophilic property.

Table 1 shows changes in the contact angles of the upper surfaces of the pixel-defining layer PDL and the first electrode EL1 before and after the operation (S600) of performing the liquid-repellent treatment on the pixel-defining layer PDL, and the operation (S700) of removing the exposed protective layer.

TABLE 1

| | Contact angle (°) | | |
|---|---|---|---|
| Operation in manufacturing process | Upper surface of pixel-defining layer | Upper surface of first electrode exposed from protective layer | Upper surface of first electrode covered with protective layer |
| Before liquid-repellent treatment | 4.7 | 4.6 | 4.6 |
| 12 hours after liquid-repellent treatment | 70.5 | 15.1 | |
| 24 hours after liquid-repellent treatment | 67.2 | 17.0 | |
| 48 hours after liquid-repellent treatment | 68.7 | 20.1 | |
| 120 hours after liquid-repellent treatment | 68.7 | 20.9 | |
| 300 hours after liquid-repellent treatment | 64.8 | 25.5 | |
| 400 hours after liquid-repellent treatment | 64.4 | 26.9 | |
| After cleaning with water | 63.0 | 12.4 | <5 |

Referring to results in Table 1, the liquid-repellent characteristics of both upper surfaces of the pixel-defining layer PDL and the first electrode EL1 were increased by liquid-repellent treatment, and when the protective layer PP or PP-1 was not provided on the first electrode EL1, the liquid-repellent characteristics of the upper surface of the first electrode EL1 were partially maintained even after the upper surface of the first electrode EL1 was cleaned with water DI. However, according to one or more embodiment of the invention, when the protective layer PP or PP-1 was provided on the first electrode EL1 while performing the liquid-repellent treatment, the hydrophilic characteristics of the first electrode EL1 were maintained. That is, one or more embodiment of a manufacturing method of a display device DD or DD-1 includes providing the preliminary protective material layer on the first electrode EL1, forming the pixel-defining layer PDL after providing the preliminary protective material layer, and performing the liquid-repellent treatment on the formed pixel-defining layer. Thus a difference between the liquid-repellent characteristics of the first electrode EL1 and the pixel-defining layer PDL may be increased significantly, thereby improving the coating characteristics, color mixing prevention characteristics, etc., of functional layers FL of light-emitting elements ED-1, ED-2, and ED-3 to be formed later.

An embodiment of the manufacturing method of a display device DD or DD-1 may include the operation (S800) of providing the functional layers FL on the first electrode EL1 after the operation (S700) of removing the exposed protective layer. The operation (S800) of providing the functional layers FL on the first electrode EL1 may include removing the exposed protective layer with water, and providing the functional layers FL on the first electrode EL1 which is exposed after removing the exposed protective layer with water DI.

Figure 7G:
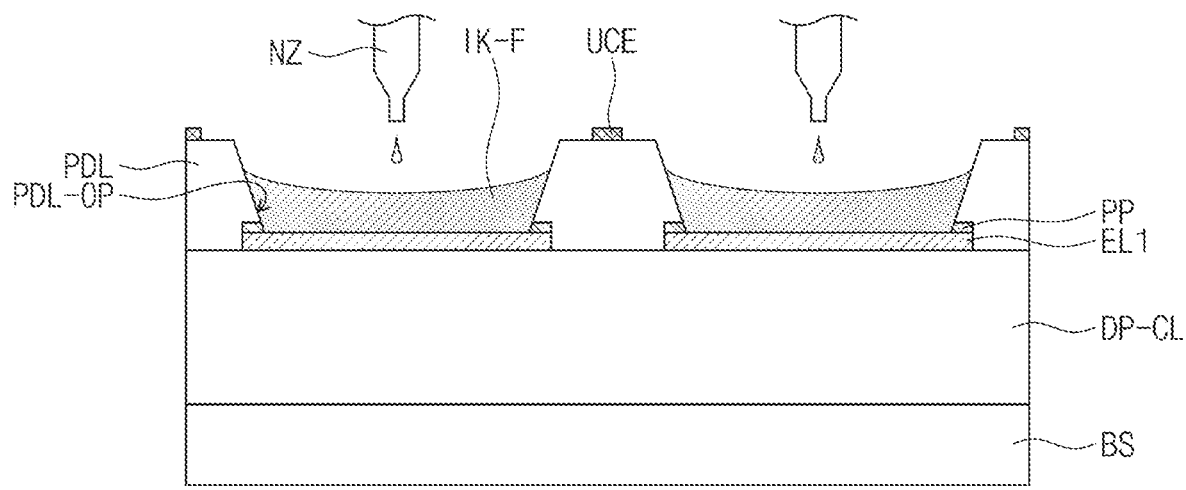
Figure 8G:
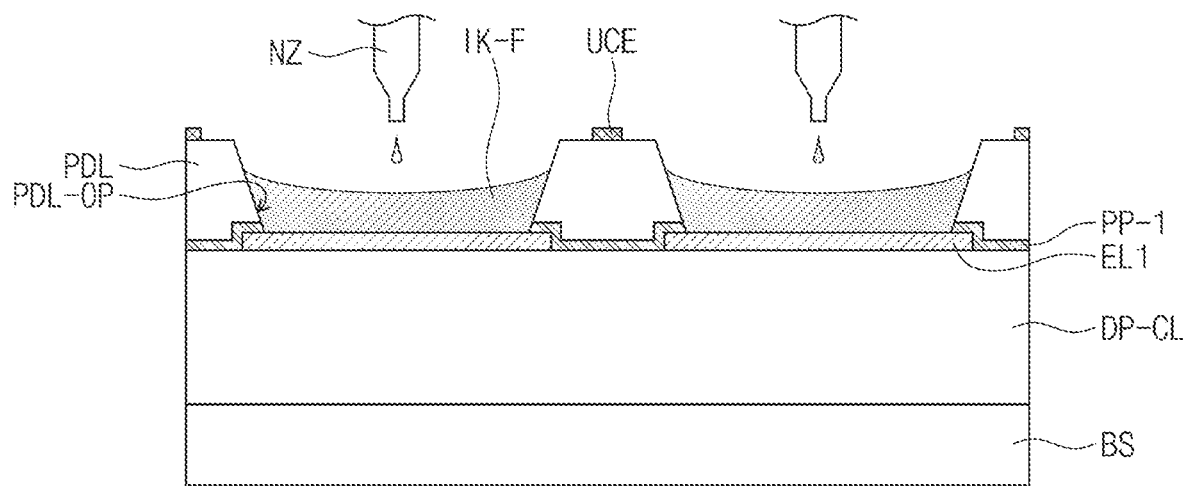

FIGS. 7G and 8G are diagrams exemplarily illustrating the operation (S800) of providing the functional layers FL on the first electrode EL1. The operation of providing the functional layers FL on the first electrode EL1 exposed after removing the protective layer (e.g., exposed first electrode) may include providing the functional layers FL through inkjet printing.

An ink material IK-F for forming the functional layers FL (e.g., functional layer material) may be provided in the opening PDL-OP of the pixel-defining layer PDL using a nozzle NZ of an inkjet printing device. The ink material IK-F may be provided to have excellent coating characteristics with respect to the first electrode EL1 due to the hydrophilic surface characteristics of the first electrode EL1. In addition, due to the hydrophobic surface characteristics of the pixel-defining layer PDL, the ink material IK-F is not provided to the upper surface of the pixel-defining layer PDL, and the ink materials IK-F provided to adjacent openings PDL-OP are not mixed with each other, and may be separately provided in the openings PDL-OP.

The ink material IK-F for forming the functional layers FL may be a hole transport region material, a light-emitting layer material, or an electron transport region material. The hole transport region material, the light-emitting layer material, and the electron transport region material may be sequentially provided through using inkjet printing.

An embodiment of the method of providing a display device DD or DD-1 may include, after the operation (S800) of providing the functional layers FL on the first electrode EL1, the operation (S900) of providing the second electrode EL2 on the functional layers FL and the auxiliary electrode UCE.

Figure 7H:
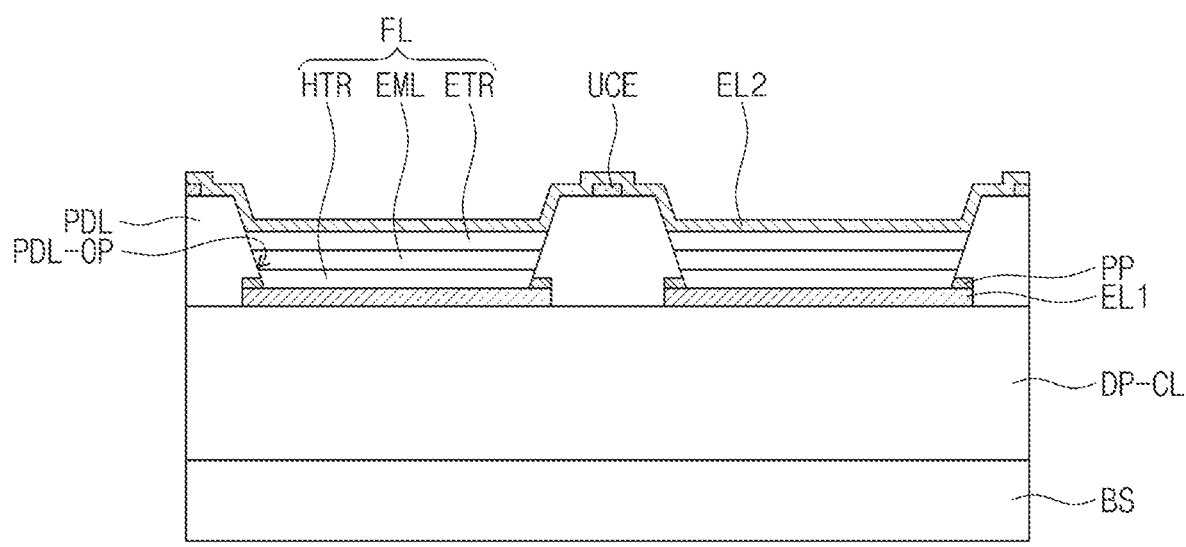
Figure 8H:
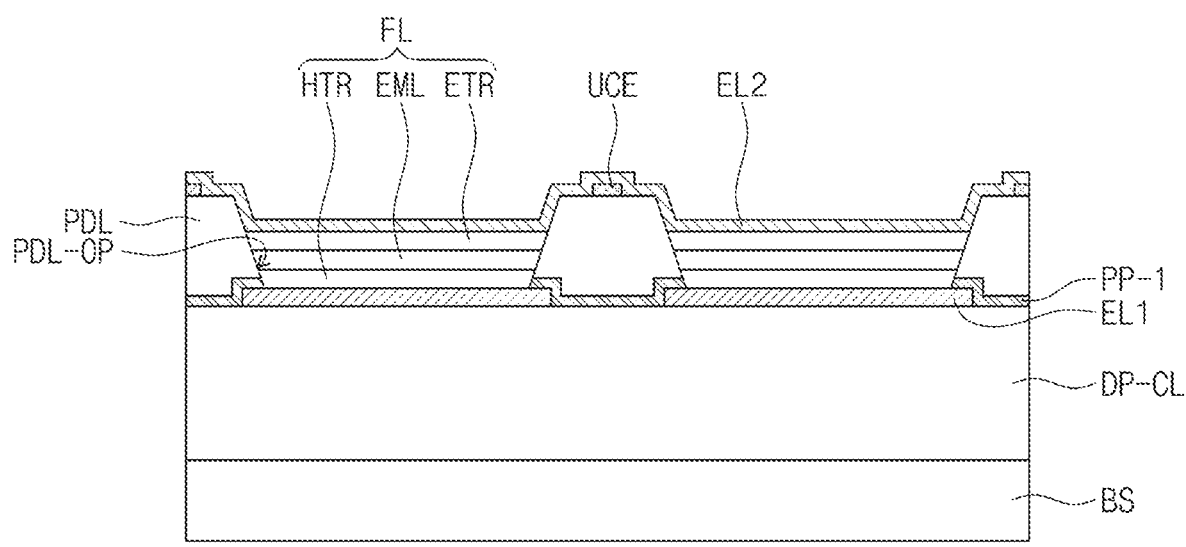

FIGS. 7H and 8H are diagrams exemplarily illustrating the operation (S900) of providing the second electrode EL2 on the functional layers FL and the auxiliary electrode UCE. The second electrode EL2 may be provided on the functional layers FL including a hole transport region HTR, a light-emitting layer EML, and an electron transport region ETR. The second electrode EL2 may be provided, as a common layer, to overlap the entirety of the functional layers FL and the pixel-defining layer PDL. The second electrode EL2 may be disposed while covering the auxiliary electrode UCE disposed on the pixel-defining layer PDL.

The second electrode EL2 may be provided through vapor deposition. The second electrode EL2 may be formed by vacuum deposition using a metal material, a metal alloy, or a conductive compound.

One or more embodiment of a method of providing a display device DD or DD-1 described with reference to FIGS. 6 to 8H includes providing the preliminary protective layer on the first electrode EL1 before the liquid-repellent treatment of the pixel-defining layer PDL, and removing an exposed portion of the preliminary protective layer after the liquid-repellent treatment, and may thus make the exposed surfaces of the pixel-defining layer PDL and the first electrode EL1 to have different physical properties from each other, thereby improving the coating characteristics of the functional layers FL. Accordingly, one or more embodiment of the manufacturing method of a display device DD or DD-1 may be used for manufacturing a display device DD or DD-1 with improved reliability and display quality.

One or more embodiment of a display device DD or DD-1 includes a protective layer PP or PP-1 including a water-soluble metal oxide, and functional layers FL having excellent adhesive characteristics to a first electrode EL1 in an opening PDL-OP of a pixel-defining layer PDL, thereby having excellent display quality and excellent reliability characteristics. One or more embodiment of a manufacturing method of a display device DD or DD-1 includes providing a preliminary protective layer including a water-soluble metal oxide on a first electrode EL1, and removing the provided preliminary protective layer after performing a liquid-repellent treatment of exposed surfaces of the pixel-defining layer PDL, so that the manufacturing method may be used for manufacturing a display device DD or DD-1 with excellent display quality and reliability characteristics.

One or more embodiment may provide a display device DD or DD-1 including a protective layer PP or PP-1 protecting the upper surface of an electrode exposed during a liquid-repellent treatment, so that functional layers FL in regions separated by a pixel-defining layer PDL have excellent coating quality.

In addition, one or more embodiment of a manufacturing method of a display device DD or DD-1 includes providing a preliminary protective layer disposed on an electrode, and removing the provided preliminary protective layer after a liquid-repellent treatment of a pixel-defining layer PDL, and thus improves adhesion of functional layers FL on an electrode, so that the manufacturing method may be used for manufacturing a display device DD or DD-1 with excellent display quality and reliability characteristics.

In the above, description has been made with reference to embodiments of the invention, but those skilled in the art or those of ordinary skill in the relevant technical field may understand that various modifications and changes may be made to the invention within the scope not departing from the spirit and the technology scope of the invention described in the claims to be described later.

Therefore, the technical scope of the invention is not limited to the contents described in the detailed description of the specification, but should be determined by the claims.

What is claimed is:

1. A method of providing a display device, the method comprising:
   providing a first electrode of a light-emitting element on a base layer;
   providing a preliminary protective layer on the first electrode;
   providing a pixel-defining layer in which an opening is defined, on the preliminary protective layer, wherein the opening exposes a portion of the preliminary protective layer which overlaps the opening and exposes surfaces of the pixel-defining layer to outside of the pixel-defining layer;
   providing an auxiliary electrode on an upper surface of the pixel-defining layer which is furthest from the base layer;
   providing a hydrophobic treatment on the pixel-defining layer having each of the auxiliary electrode on the upper surface thereof, on the portion of the preliminary protective layer which overlaps the opening and on the surfaces of the pixel-defining layer exposed by the opening;
   providing removal of the portion of the preliminary protective layer at the opening, by water-dissolving the portion of the preliminary protective layer, to provide each of:
      an exposed portion of the first electrode which is exposed to outside of the pixel-defining layer at the opening, and
      a protective layer between the pixel-defining layer and the first electrode as a remaining portion of the preliminary protective layer;
   providing a functional layer of the light-emitting element, on the exposed portion of the first electrode; and
   providing a second electrode of the light-emitting element, facing the base layer with the pixel-defining layer, the functional layer and the auxiliary electrode therebetween.

2. The method of claim 1, wherein the preliminary protective layer comprise a water-soluble metal oxide.

3. The method of claim 1, wherein the providing of the hydrophobic treatment comprises providing CF4 plasma to each of the auxiliary electrode on the upper surface of the pixel-defining layer. the portion of the preliminary protective layer exposed by the opening and the surfaces of the pixel-defining layer exposed by the opening.

4. The method of claim 1, wherein, the providing of the removal of the portion of the preliminary protective layer at the opening comprises removing the preliminary protective layer at a speed of about 50 angstroms per minute to about 100 angstroms per minute.

5. The method of claim 1, wherein after the providing of the hydrophobic treatment and removal of the portion of the preliminary protective layer at the opening:
   each of the surfaces of the pixel-defining layer and the exposed portion of the first electrode has a contact angle with methylethylbenzoate,
   the contact angle of methylethylbenzoate with the surfaces of the pixel-defining layer is about 60° or more, and
   the contact angle of methylethylbenzoate with the exposed portion of the first electrode is about 5° or less.

6. The method of claim 1, wherein the providing of the functional layer on the exposed portion of the first electrode comprises inkjet printing each of:
   a hole transport layer on the first electrode,
   a light-emitting layer on the hole transport layer, and
   an electron transport layer on the light-emitting layer.

7. The method of claim 1, wherein the providing of the second electrode facing the base layer with the pixel-defining layer, the functional layer and the auxiliary electrode therebetween, comprises providing the second electrode through vapor deposition.

8. The method of claim 1, wherein the providing of the preliminary protective layer comprises providing the preliminary protective layer to cover the first electrode on the base layer.

9. The method of claim 8, wherein the providing of the removal of the portion of the preliminary protective layer at the opening disposes an entirety of the pixel-defining layer overlapping the protective layer.

* * * * *